(12) United States Patent
Hsieh

(10) Patent No.: US 12,112,950 B2
(45) Date of Patent: Oct. 8, 2024

(54) SEMICONDUCTOR DEVICE WITH PROTECTION LAYER AND METHOD FOR FABRICATING THE SAME

(71) Applicant: NANYA TECHNOLOGY CORPORATION, New Taipei (TW)

(72) Inventor: Ming-Hung Hsieh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 254 days.

(21) Appl. No.: 17/667,667

(22) Filed: Feb. 9, 2022

(65) Prior Publication Data
US 2023/0253209 A1 Aug. 10, 2023

(51) Int. Cl.
| | |
|---|---|
| *H10B 43/27* | (2023.01) |
| *H01L 21/02* | (2006.01) |
| *H01L 21/28* | (2006.01) |
| *H01L 21/285* | (2006.01) |
| *G11C 8/14* | (2006.01) |

(52) U.S. Cl.
CPC .. *H01L 21/28061* (2013.01); *H01L 21/02532* (2013.01); *H01L 21/28556* (2013.01); *H10B 43/27* (2023.02); *G11C 8/14* (2013.01)

(58) Field of Classification Search
CPC ......... H01L 21/28061; H01L 21/02532; H01L 21/28556; H01L 21/28088; H10B 43/27; H10B 12/09; H10B 12/34; H10B 12/488; H10B 12/50; G11C 8/14
See application file for complete search history.

(56) References Cited

U.S. PATENT DOCUMENTS

| | | | | |
|---|---|---|---|---|
| 6,440,830 B1* | 8/2002 | Lopatin | ............. | H01L 29/66545 257/E21.507 |
| 2009/0108356 A1* | 4/2009 | Cheng | ................... | H01L 27/105 257/E29.264 |
| 2012/0302060 A1* | 11/2012 | Hsu | ..................... | H01L 21/7684 257/E21.585 |
| 2018/0226409 A1* | 8/2018 | Wang | ................... | H10B 12/485 |
| 2019/0115351 A1 | 4/2019 | Jeon et al. | | |

(Continued)

FOREIGN PATENT DOCUMENTS

| | | |
|---|---|---|
| TW | 201731104 A | 9/2017 |
| TW | 202011517 A | 3/2020 |

(Continued)

OTHER PUBLICATIONS

Office Action and Search Report mailed on Oct. 18, 2023 related to U.S. Appl. No. 17/667,813.

(Continued)

*Primary Examiner* — Robert G Bachner
*Assistant Examiner* — Sandra Milena Rodriguez Villan
(74) *Attorney, Agent, or Firm* — Xuan Zhang

(57) ABSTRACT

The present application discloses a semiconductor device and a method for fabricating the semiconductor device. The semiconductor device includes a substrate; and a first gate stack positioned on the substrate and including: a first gate dielectric layer positioned on the substrate; a first gate protection layer positioned on the first gate dielectric layer and including titanium silicon nitride; a first work function layer positioned on the first gate protection layer; and a first gate filler layer positioned on the first work function layer.

14 Claims, 23 Drawing Sheets

(56) References Cited

U.S. PATENT DOCUMENTS

| | | | |
|---|---|---|---|
| 2020/0035815 A1 | 1/2020 | Wu et al. | |
| 2020/0098640 A1* | 3/2020 | Savant | H01L 21/28176 |
| 2020/0194569 A1 | 6/2020 | Wang et al. | |
| 2020/0312845 A1* | 10/2020 | Yoon | H01L 21/76224 |
| 2020/0373306 A1 | 11/2020 | Kim et al. | |
| 2020/0402839 A1 | 12/2020 | Im et al. | |
| 2021/0242092 A1* | 8/2021 | Chen | H01L 29/66795 |
| 2021/0384197 A1* | 12/2021 | Jung | H01L 21/02181 |
| 2021/0408259 A1 | 12/2021 | Cheng | |
| 2022/0302253 A1 | 9/2022 | Zhang | |

FOREIGN PATENT DOCUMENTS

| | | |
|---|---|---|
| TW | 202114228 A | 4/2021 |
| TW | 202201551 A | 1/2022 |

OTHER PUBLICATIONS

Office Action and Search Report mailed on Nov. 22, 2022 related to Taiwanese Application No. 111114238.
Office Action and Search Report mailed on Jan. 31, 2023 related to Taiwanese Application No. 111114235.
Office Action and Search Report mailed on Jan. 12, 2024 related to U.S. Appl. No. 17/667,813.
Office Action and Search Report mailed on Mar. 22, 2024 related to U.S. Appl. No. 17/667,813.

* cited by examiner

SEMICONDUCTOR DEVICE WITH PROTECTION LAYER AND METHOD FOR FABRICATING THE SAME

TECHNICAL FIELD

The present disclosure relates to a semiconductor device and a method for fabricating the semiconductor device, and more particularly, to a semiconductor device with a protection layer and a method for fabricating the semiconductor device with the protection layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; and a first gate stack positioned on the substrate and including: a first gate dielectric layer positioned on the substrate; a first gate protection layer positioned on the first gate dielectric layer and including titanium silicon nitride; a first work function layer positioned on the first gate protection layer; and a first gate filler layer positioned on the first work function layer.

Another aspect of the present disclosure provides a semiconductor device including a substrate including an array area and a peripheral area surrounding the array area; a word line structure positioned in the array area; and a first gate stack positioned on the peripheral area and including: a first gate dielectric layer positioned on the peripheral area; a first gate protection layer positioned on the first gate dielectric layer and including titanium silicon nitride; a first work function layer positioned on the first gate protection layer; and a first gate filler layer positioned on the first work function layer.

Another aspect of the present disclosure provides a method for fabricating a semiconductor device including providing a substrate including an array area and a peripheral area surrounding the array area; forming a word line trench in the array area; conformally forming a layer of first insulating material in the word line trench and on the substrate; conformally forming a layer of protection material on the layer of first insulating material formed on the peripheral area; conformally forming a layer of first work function material on the layer of protection material; conformally forming a layer of first barrier material on the layer of first insulating material and the layer of first work function material; forming a layer of filler material on the layer of first barrier material; and patterning the layer of first insulating material, the layer of protection material, the layer of first work function material, the layer of first barrier material, and the layer of filler material to form a first gate stack on the peripheral area and a word line structure in the array area. The protection material includes titanium silicon nitride.

Due to the design of the semiconductor device of the present disclosure, the first gate protection layer including titanium silicon nitride may have a low resistivity and an excellent barrier property, and is stable under heat. Thus, the first gate stack including the first gate protection layer formed of titanium silicon nitride may have excellent characteristics. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
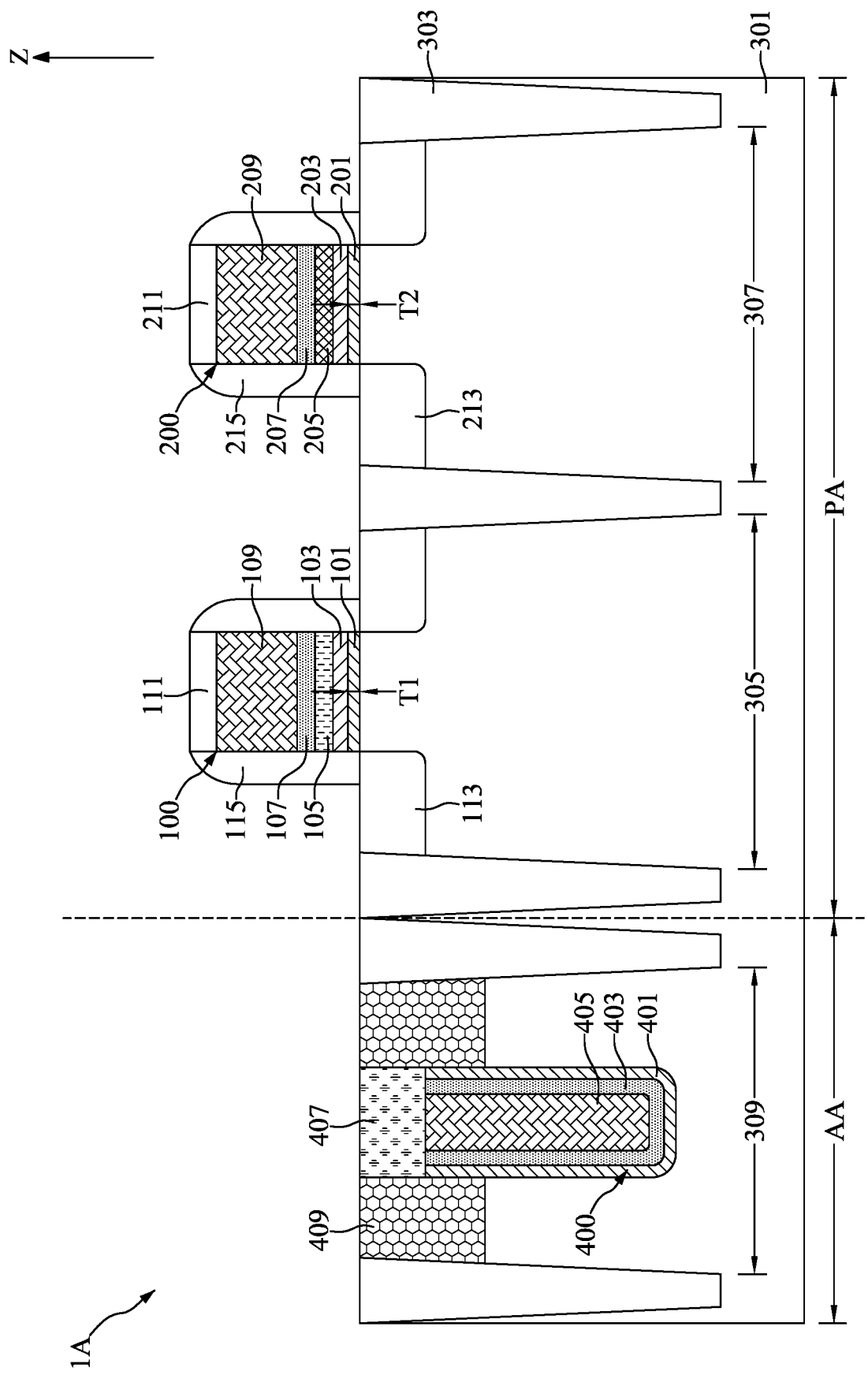
FIG. 1 illustrates, in a schematic cross-sectional view diagram, a semiconductor device accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a substrate 301, an isolation layer 303, a first gate stack 100, a first gate capping layer 111, a plurality of first impurity regions 113, a first spacer layer 115, a second gate stack 200, a second gate capping layer 211, a plurality of second impurity regions 213, a second spacer layer 215, a word line structure 400, and a plurality of word line impurity regions 409.

With reference to FIG. 1, the substrate 301 may include an array area AA and a peripheral area PA. The peripheral area PA may surround the array area AA in a top-view perspective (not shown). In some embodiments, the substrate 301 may be a bulk semiconductor substrate that is composed entirely of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 301 may include a semiconductor-on-insulator structure which consists of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of the present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 1, the isolation layer 303 may be disposed in the array area AA and the peripheral area PA of the substrate 301. The isolation layer 303 may be formed of, for example, an insulating material such as silicon oxide, silicon nitride, silicon oxynitride, silicon nitride oxide, or fluoride-doped silicate. The isolation layer 303 may define a first active area 305 and a second active area 307 in the peripheral area PA, and an array active area 309 in the array area AA. In some embodiments, the second active area 307 may be disposed next to the first active area 305. In some embodiments, the first active area 305 and the second active area 307 may be separated from each other.

It should be noted that the first active area 305 may comprise a portion of the substrate 301 and a space above the portion of the substrate 301. Describing an element as being disposed on the first active area 305 means that the element is disposed on a top surface of the portion of the substrate 301. Describing an element as being disposed in the first active area 305 means that the element is disposed in the portion of the substrate 301; however, a top surface of the element may be even with the top surface of the portion of the substrate 301. Describing an element as being disposed above (or over) the first active area 305 means that the element is disposed above the top surface of the portion of the substrate 301. Accordingly, the second active area 307 and the array active area 309 may comprise other portions of the substrate 301 and spaces above the other portions of the substrate 301, respectively and correspondingly.

With reference to FIG. 1, the first gate stack 100 may be disposed on the first active area 305 and may include a first gate dielectric layer 101, a first gate protection layer 103, a first work function layer 105, a first gate barrier layer 107, and a first gate filler layer 109.

With reference to FIG. 1, the first gate dielectric layer 101 may be disposed on the first active area 305. In some embodiments, the thickness T1 of the first gate dielectric layer 101 may be between about 0.5 nm and about 5.0 nm. Preferably, the thickness T1 of the first gate dielectric layer 101 may be between about 0.5 nm and about 2.5 nm. In some embodiments, the first gate dielectric layer 101 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be, for example, hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

With reference to FIG. 1, the first gate protection layer 103 may be disposed on the first gate dielectric layer 101. The first gate protection layer 103 may be formed of titanium silicon nitride. The first gate protection layer 103 may have a low resistivity and an excellent barrier property, and is stable under heat. Thus, the first gate stack 100 including the first gate protection layer 103 formed of titanium silicon nitride may have excellent characteristics. In some embodiments, the resistivity of the first gate protection layer 103 may be between about 500 μΩ·cm and about 5000 μΩ·cm. In some embodiments, the titanium content in the first gate protection layer 103 may be about 10 to 40 atomic percent. The silicon content in the first gate protection layer 103 may be about 10 to 40 atomic percent. The nitrogen content in the first gate protection layer 103 may be about 25 to 47 atomic percent.

With reference to FIG. 1, the first work function layer 105 may be disposed on the first gate protection layer 103. In some embodiments, the thickness of the first work function layer 105 may be between about 10 angstroms and about 200 angstroms. Preferably, the thickness of the first work function layer 105 may be between about 10 angstroms and about 100 angstroms. In some embodiments, the first work function layer 105 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

With reference to FIG. 1, the first gate barrier layer 107 may be disposed on the first work function layer 105. In some embodiments, the first gate barrier layer 107 may be, for example, titanium nitride, or titanium/titanium nitride bi-layer.

With reference to FIG. 1, the first gate filler layer 109 may be disposed on the first gate barrier layer 107. In some embodiments, the first gate filler layer 109 may be formed of, for example, tungsten or aluminum.

With reference to FIG. 1, the first gate capping layer 111 may be disposed on the first gate filler layer 109. In some embodiments, the first gate capping layer 111 may be formed of, for example, silicon oxide, silicon nitride, silicon oxynitride, silicon nitride oxide, or fluoride-doped silicate.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, the plurality of first impurity regions 113 may be disposed in the first active area 305 and adjacent to two ends of the first gate dielectric layer 101. The plurality of first impurity regions 113 may have a first electrical type (e.g., n-type or p-type). In some embodiments, the plurality of first impurity regions 113 may include p-type dopants such as boron, aluminum, gallium, and indium. In some embodiments, the plurality of first impurity regions 113 may include n-type dopants such as antimony, arsenic, and phosphorus. In some embodiments, the dopant concentration of the plurality of first impurity regions 113 may be between about 1E19 atoms/cm^3 and about 1E21 atoms/cm^3.

With reference to FIG. 1, the first spacer layer 115 may be disposed on the sidewall of the first gate stack 100. In some embodiments, the first spacer layer 115 may be formed of, for example, silicon oxide, silicon nitride, silicon oxynitride, or silicon nitride oxide. In some embodiments, the first spacer layer 115 may be formed of the same material as the first gate capping layer 111.

With reference to FIG. 1, the second gate stack 200 may be disposed on the second active area 307 and may include a second gate dielectric layer 201, a second gate protection layer 203, a second work function layer 205, a second gate barrier layer 207, and a second gate filler layer 209.

With reference to FIG. 1, the second gate dielectric layer 201 may be disposed on the second active area 307. In some embodiments, the thickness T2 of the second gate dielectric layer 201 may be between about 0.5 nm and about 5.0 nm. Preferably, the thickness T2 of the second gate dielectric layer 201 may be between about 0.5 nm and about 2.5 nm. In some embodiments, the thickness T2 of the second gate dielectric layer 201 and the thickness T1 of the first gate dielectric layer 101 may be substantially the same. In some embodiments, the thickness T2 of the second gate dielectric layer 201 and the thickness T1 of the first gate dielectric layer 101 may be different. In some embodiments, the second gate dielectric layer 201 may be formed of the same material as the first gate dielectric layer 101. In some embodiments, the second gate dielectric layer 201 may be formed of, for example, an insulating material having a dielectric constant of about 4.0 or greater.

With reference to FIG. 1, the second gate protection layer 203 may be disposed on the second gate dielectric layer 201. The second gate protection layer 203 may be formed of titanium silicon nitride. The second gate protection layer 203 may have a low resistivity and an excellent barrier property, and is stable under heat. Thus, the second gate stack 200 including the second gate protection layer 203 formed of titanium silicon nitride may have excellent characteristics. In some embodiments, the resistivity of the second gate protection layer 203 may be between about 500 μΩ·cm and about 5000 μΩ·cm. In some embodiments, the titanium content in the second gate protection layer 203 may be about 10 to 40 atomic percent. The silicon content in the second gate protection layer 203 may be about 10 to 40 atomic percent. The nitrogen content in the second gate protection layer 203 may be about 25 to 47 atomic percent.

With reference to FIG. 1, the second work function layer 205 may be disposed on the second gate protection layer 203. In some embodiments, the thickness of the second work function layer 205 may be between about 10 angstroms and about 200 angstroms. Preferably, the thickness of the second work function layer 205 may be between about 10 angstroms and about 100 angstroms. In some embodiments, the thickness of the second work function layer 205 and the thickness of the first work function layer 105 may be substantially the same. In some embodiments, the thickness of the second work function layer 205 and the thickness of the first work function layer 105 may be different. In some embodiments, the second work function layer 205 may be formed of the same material as the first work function layer 105. In some embodiments, the second work function layer 205 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

With reference to FIG. 1, the second gate barrier layer 207 may be disposed on the second work function layer 205. In some embodiments, the second gate barrier layer 207 may be formed of the same material as the first gate barrier layer 107. In some embodiments, the second gate barrier layer 207 may be, for example, titanium nitride, or titanium/titanium nitride bi-layer.

With reference to FIG. 1, the second gate filler layer 209 may be disposed on the second gate barrier layer 207. In some embodiments, the second gate filler layer 209 may be formed of the same material as the first gate filler layer 109. In some embodiments, the second gate filler layer 209 may be formed of, for example, tungsten or aluminum.

With reference to FIG. 1, the second gate capping layer 211 may be disposed on the second gate filler layer 209. In some embodiments, the second gate capping layer 211 may be formed of the same material as the first gate capping layer 111. In some embodiments, the second gate capping layer 211 may be formed of, for example, silicon oxide, silicon nitride, silicon oxynitride, silicon nitride oxide, or fluoride-doped silicate.

With reference to FIG. 1, the plurality of second impurity regions 213 may be disposed in the second active area 307 and adjacent to the second gate dielectric layer 201. In some embodiments, the plurality of second impurity regions 213 may have the same electrical type as the plurality of first impurity regions 113. In some embodiments, the electrical type of the plurality of second impurity regions 213 and the electrical type of the plurality of first impurity regions 113 may be different. In some embodiments, the plurality of second impurity regions 213 may include p-type dopants such as boron, aluminum, gallium, and indium. In some embodiments, the plurality of second impurity regions 213 may include n-type dopants such as antimony, arsenic, and phosphorus. In some embodiments, the dopant concentration of the plurality of second impurity regions 213 may be between about 1E19 atoms/cm^3 and about 1E21 atoms/cm^3.

With reference to FIG. 1, the second spacer layer 215 may be disposed on the sidewall of the second gate stack 200. In some embodiments, the second spacer layer 215 may be formed of the same material as the first spacer layer 115. In some embodiments, the second spacer layer 215 may be formed of, for example, silicon oxide, silicon nitride, silicon oxynitride, or silicon nitride oxide. In some embodiments, the second spacer layer 215 may be formed of the same material as the second gate capping layer 211.

With reference to FIG. 1, the word line structure 400 may be disposed in the array active area 309. The word line structure 400 may include a word line insulating layer 401, a word line barrier layer 403, a word line conductive layer 405, and a word line capping layer 407.

With reference to FIG. 1, the word line insulating layer 401 may be inwardly disposed in the array active area 309. The word line insulating layer 401 may have a U-shaped cross-sectional profile. Corner effects may be avoided with the U-shaped cross-sectional profile. In some embodiments, the word line insulating layer 401 may be formed of, for example, an insulating material having a dielectric constant of about 4.0 or greater. Alternatively, in another embodiment, the insulating material may be silicon oxide, silicon nitride, silicon oxynitride, silicon nitride oxide, or the like.

With reference to FIG. 1, the word line barrier layer 403 may be disposed on the word line insulating layer 401. The word line barrier layer 403 may have a U-shaped cross-sectional profile. In some embodiments, the word line barrier layer 403 may be formed of the same material as the first gate barrier layer 107. In some embodiments, the word line barrier layer 403 may be, for example, titanium nitride, or titanium/titanium nitride bi-layer.

With reference to FIG. 1, the word line conductive layer 405 may be disposed on the word line barrier layer 403. In some embodiments, the word line conductive layer 405 may be formed of the same material as the first gate filler layer 109. In some embodiments, the word line conductive layer 405 may be formed of, for example, tungsten or aluminum. In some embodiments, the word line conductive layer 405 may be formed of, for example, a conductive material such as doped polysilicon, silicon germanium, metal, metal alloy, metal silicide, metal nitride, metal carbide, or a combination including multilayers thereof. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like.

With reference to FIG. 1, the word line capping layer 407 may be disposed on the word line insulating layer 401, the word line barrier layer 403, and the word line conductive layer 405. The top surface of the word line capping layer 407 and the top surface of the substrate 301 may be substantially coplanar. In some embodiments, the word line capping layer 407 may be formed of, for example, silicon oxide, silicon nitride, silicon oxynitride, silicon nitride oxide, or fluoride-doped silicate.

With reference to FIG. 1, the plurality of word line impurity regions 409 may be disposed in the array active area 309 and adjacent to the word line structure 400. In some embodiments, the plurality of word line impurity regions 409 may include p-type dopants such as boron, aluminum, gallium, and indium. In some embodiments, the plurality of word line impurity regions 409 may include n-type dopants such as antimony, arsenic, and phosphorus. In some embodiments, the dopant concentration of the plurality of word line impurity regions 409 may be between about 1E19 atoms/cm^3 and about 1E21 atoms/cm^3.

Figure 2:
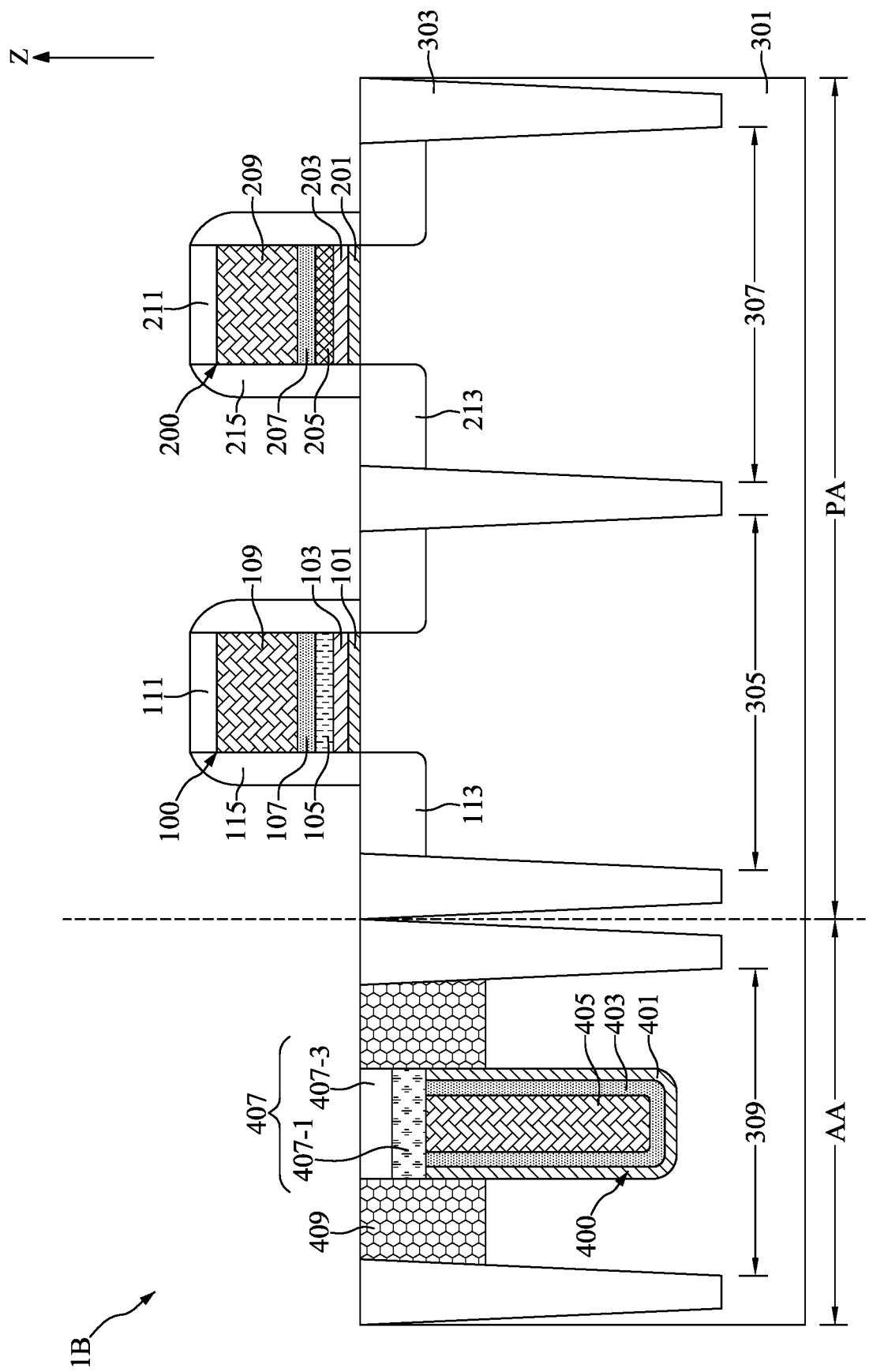
FIG. 2 illustrates, in a schematic cross-sectional view diagram, a semiconductor device in accordance with another embodiment of the present disclosure.

FIG. 2 illustrates, in a schematic cross-sectional view diagram, a semiconductor device 1B in accordance with another embodiment of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

In the semiconductor device 1B, the word line capping layer 407 may include a bottom portion 407-1 and a top portion 407-3. The bottom portion 407-1 may be disposed on the word line insulating layer 401, the word line barrier layer 403, and the word line conductive layer 405. The top portion 407-3 may be disposed on the bottom portion 407-1. The top surface of the top portion 407-3 and the top surface of the substrate 301 may be substantially coplanar. The bottom portion 407-1 may be formed of an insulating material having a dielectric constant of about 4.0 or greater. The top portion 407-3 may be formed of a low dielectric-constant material such as silicon oxide, or the like. The top portion 407-3 formed of the low dielectric-constant material may reduce electric field on the top surface of substrate 301; therefore, leakage current may be reduced.

FIGS. 3 to 8 illustrate, in schematic cross-sectional view diagrams, part of semiconductor devices 1C, 1D, 1E, 1F, 1G, and 1H in accordance with some embodiments of the present disclosure.

Figure 3:
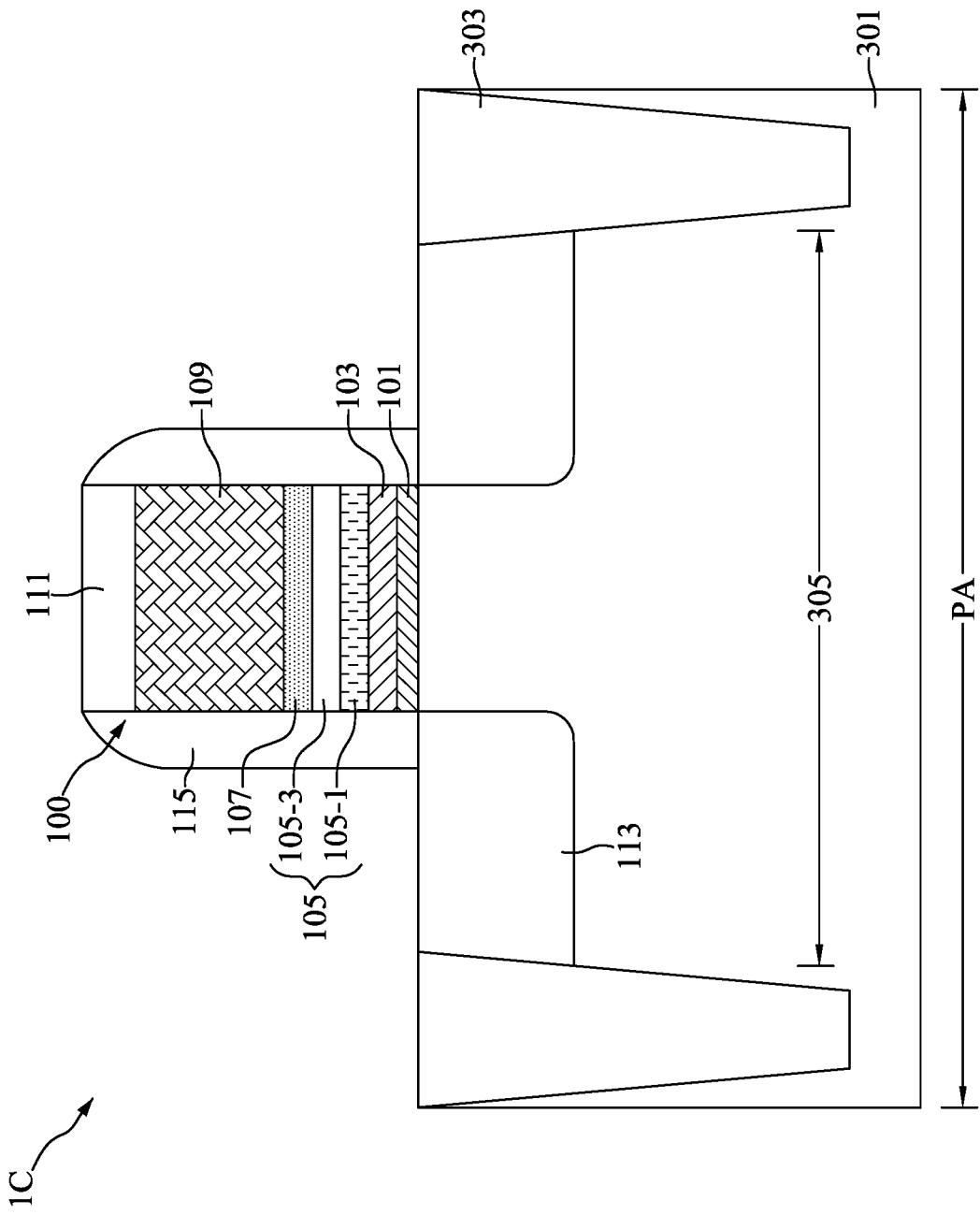
FIGS. 3 to 8 illustrate, in schematic cross-sectional view diagrams, part of semiconductor devices in accordance with some embodiments of the present disclosure.

With reference to FIG. 3, the semiconductor device 1C may have a structure similar to that illustrated in FIG. 1. The same or similar elements in FIG. 3 as in FIG. 1 have been marked with similar reference numbers and duplicative descriptions have been omitted.

In the semiconductor device 1C, the first work function layer 105 may include a bottom work function layer 105-1 and a top work function layer 105-3. The bottom work function layer 105-1 may be disposed on the first gate protection layer 103. The top work function layer 105-3 may be disposed between the bottom work function layer 105-1 and the first gate barrier layer 107.

The bottom work function layer 105-1 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The top work function layer 105-3 may be formed of, for example, titanium nitride, tantalum nitride, tantalum carbide, tungsten nitride, or ruthenium.

Figure 4:
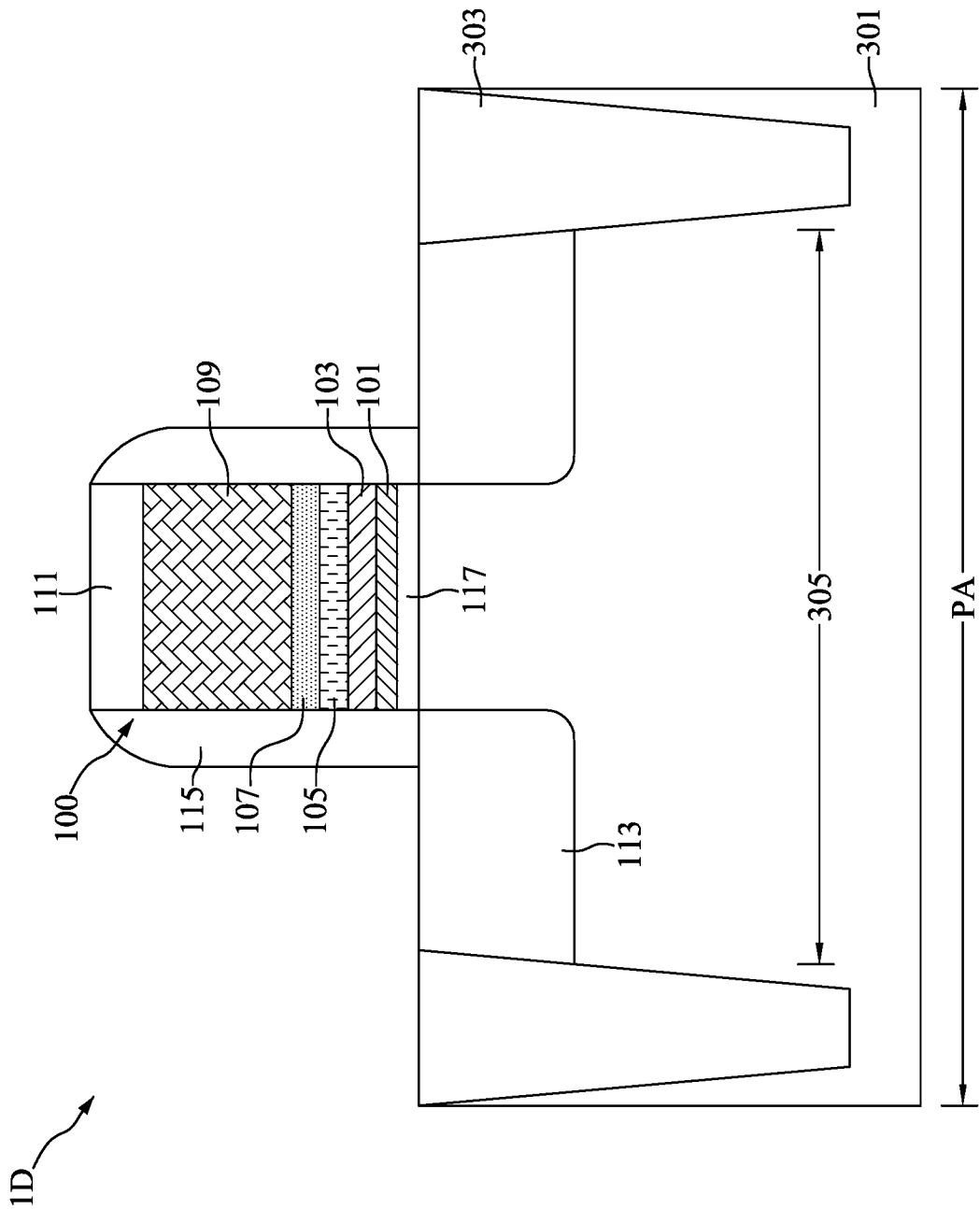

With reference to FIG. 4, the semiconductor device 1D may have a structure similar to that illustrated in FIG. 1. The same or similar elements in FIG. 4 as in FIG. 1 have been marked with similar reference numbers and duplicative descriptions have been omitted.

In the semiconductor device 1D, an interfacial layer 117 may be disposed between the substrate 301 and the first gate dielectric layer 101. In some embodiments, the thickness of the interfacial layer 117 may be between about 5 angstroms and about 20 angstroms. The interfacial layer 117 may be formed of a chemical oxide of the substrate 301 such as silicon oxide. The interfacial layer 117 may facilitate formation of the first gate dielectric layer 101.

Figure 5:
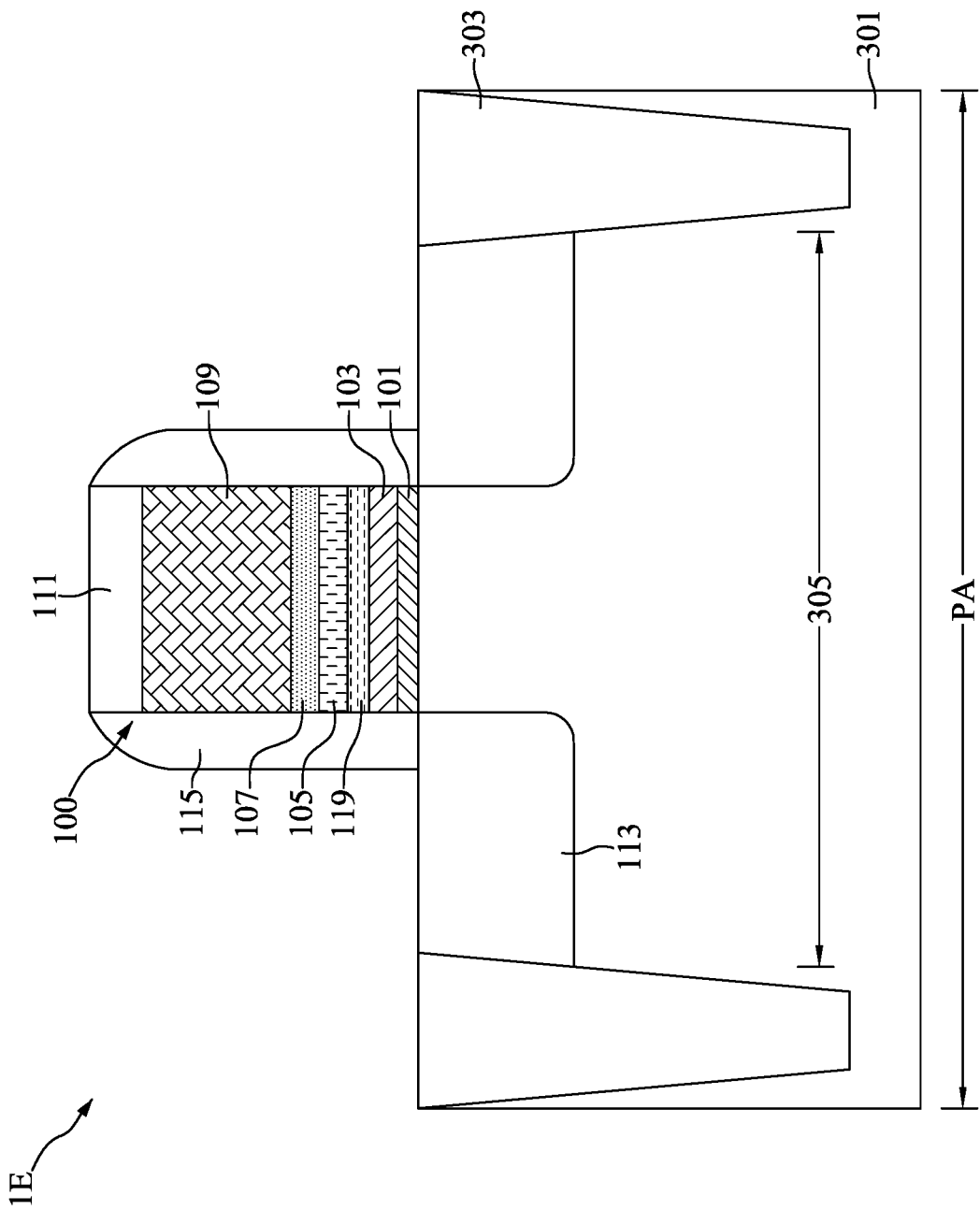

With reference to FIG. 5, the semiconductor device 1E may have a structure similar to that illustrated in FIG. 1. The same or similar elements in FIG. 5 as in FIG. 1 have been marked with similar reference numbers and duplicative descriptions have been omitted.

In the semiconductor device 1E, an adjustment layer 119 may be disposed between the first gate protection layer 103 and the first work function layer 105. In some embodiments, the adjustment layer 119 may include a material or an alloy including lanthanide nitride. The adjustment layer 119 may be used to fine-tune the threshold voltage of the first gate stack 100.

Figure 6:
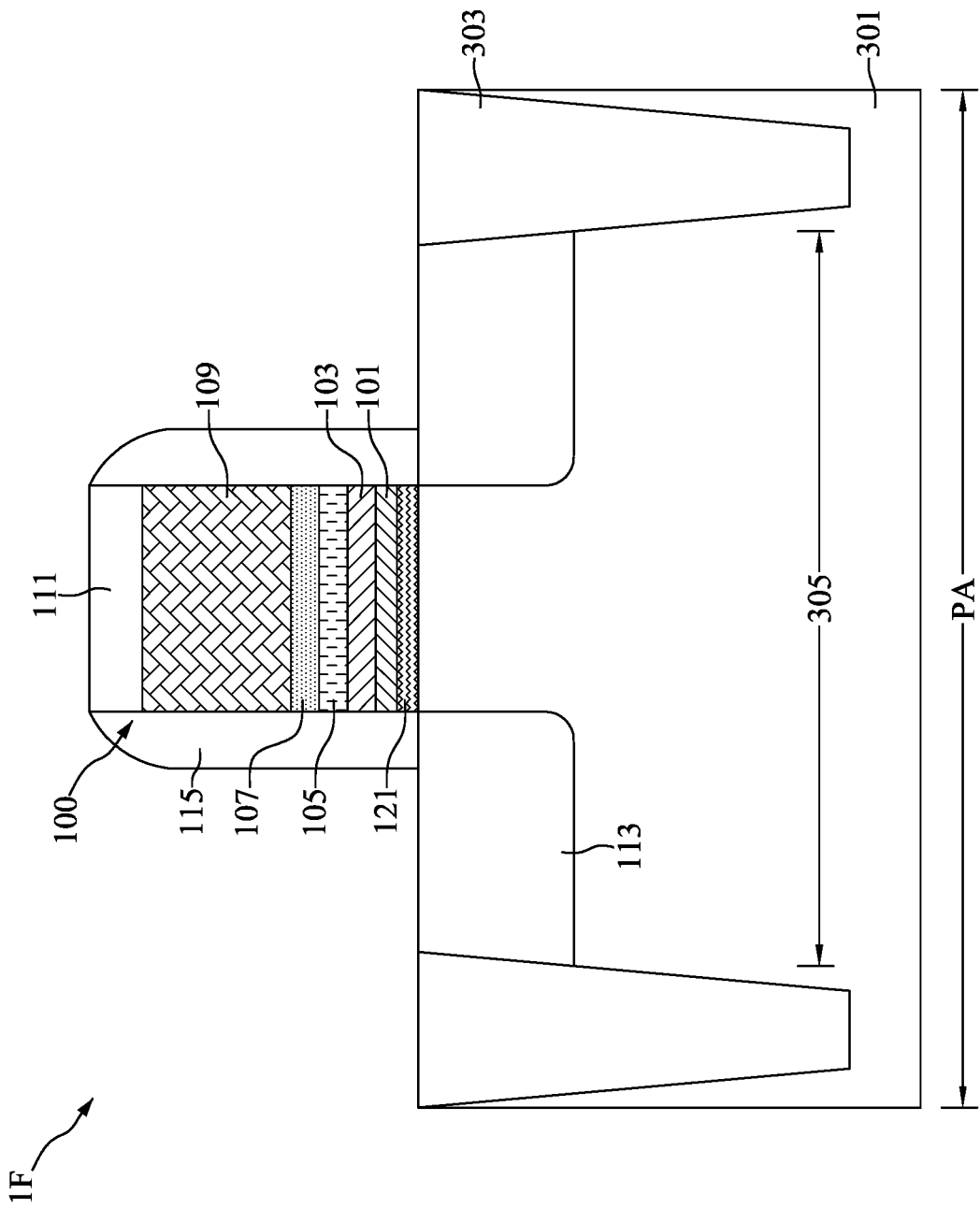

With reference to FIG. 6, the semiconductor device 1F may have a structure similar to that illustrated in FIG. 1. The same or similar elements in FIG. 6 as in FIG. 1 have been marked with similar reference numbers and duplicative descriptions have been omitted.

In the semiconductor device 1F, a dipole layer 121 may be disposed between the substrate 301 and the first gate dielectric layer 101. In some embodiments, the dipole layer 121 may have a thickness less than 2 nm. The dipole layer 121 may displace defects in the first gate dielectric layer 101 and may improve the mobility and reliability of the first gate dielectric layer 101. The dipole layer 121 may be formed of a material including one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, aluminum oxide, aluminum silicon oxide, titanium oxide, titanium silicon oxide, hafnium oxide, hafnium silicon oxide, zirconium oxide, zirconium silicon oxide, tantalum oxide, tantalum silicon oxide, scandium oxide, scandium silicon oxide, magnesium oxide, and magnesium silicon oxide.

Figure 7:
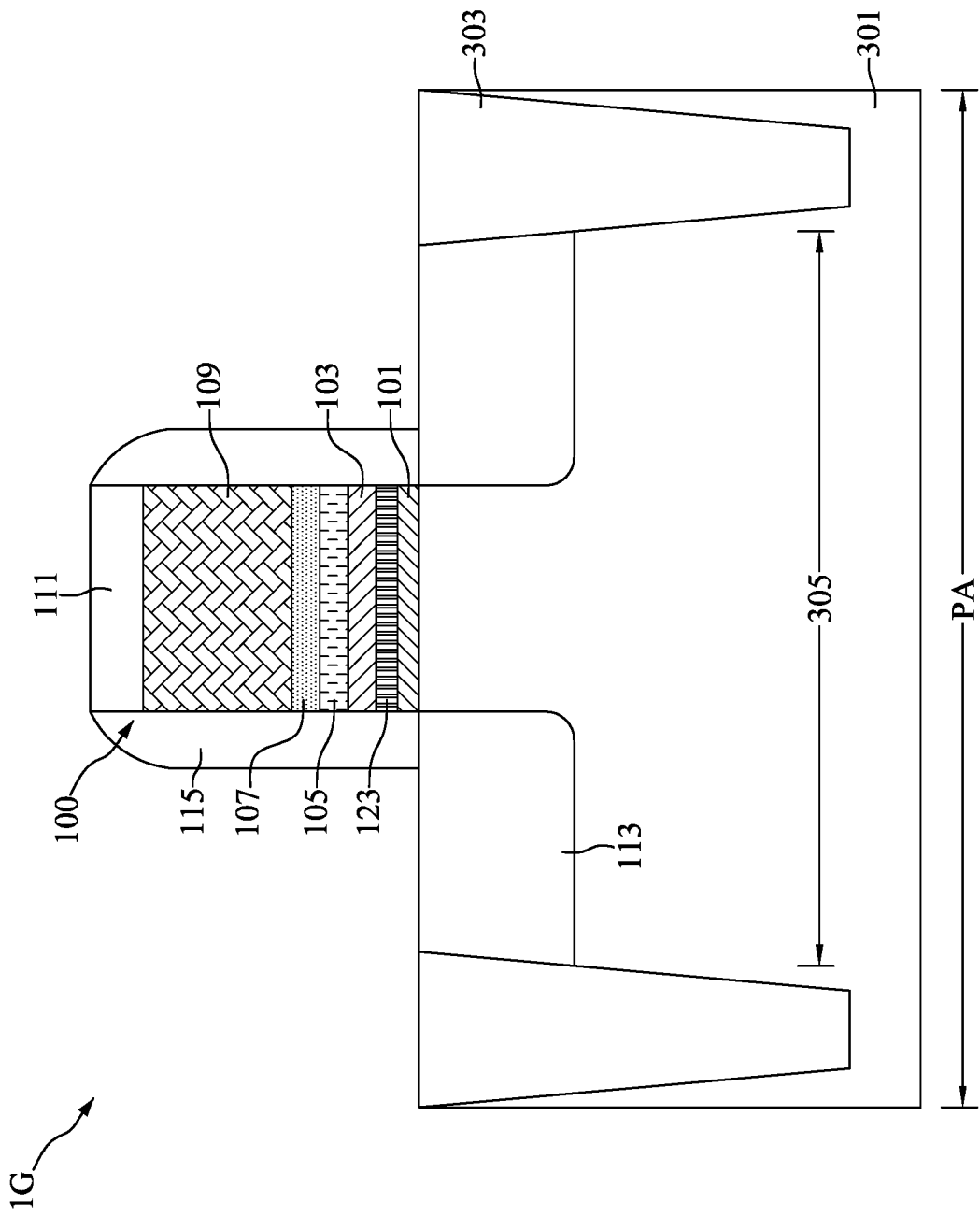

With reference to FIG. 7, the semiconductor device 1G may have a structure similar to that illustrated in FIG. 1. The same or similar elements in FIG. 7 as in FIG. 1 have been marked with similar reference numbers and duplicative descriptions have been omitted.

In the semiconductor device 1G, a functional layer 123 may be disposed between the first gate dielectric layer 101 and the first gate protection layer 103. In some embodiments, the functional layer 123 may have a thickness between about 10 angstroms and about 15 angstroms. In some embodiments, the functional layer 123 may be formed of, for example, titanium nitride or tantalum nitride. The functional layer 123 may protect the first gate dielectric layer 101 from damage during subsequent semiconductor processes. In some embodiments, the functional layer 123 may be formed of, for example, titanium and titanium silicide. The functional layer 123 may further reduce the resistivity of the first gate protection layer 103. Thus, the characteristics of the first gate stack 100 may be improved. As a result, the performance of the semiconductor device 1G may be improved.

Figure 8:
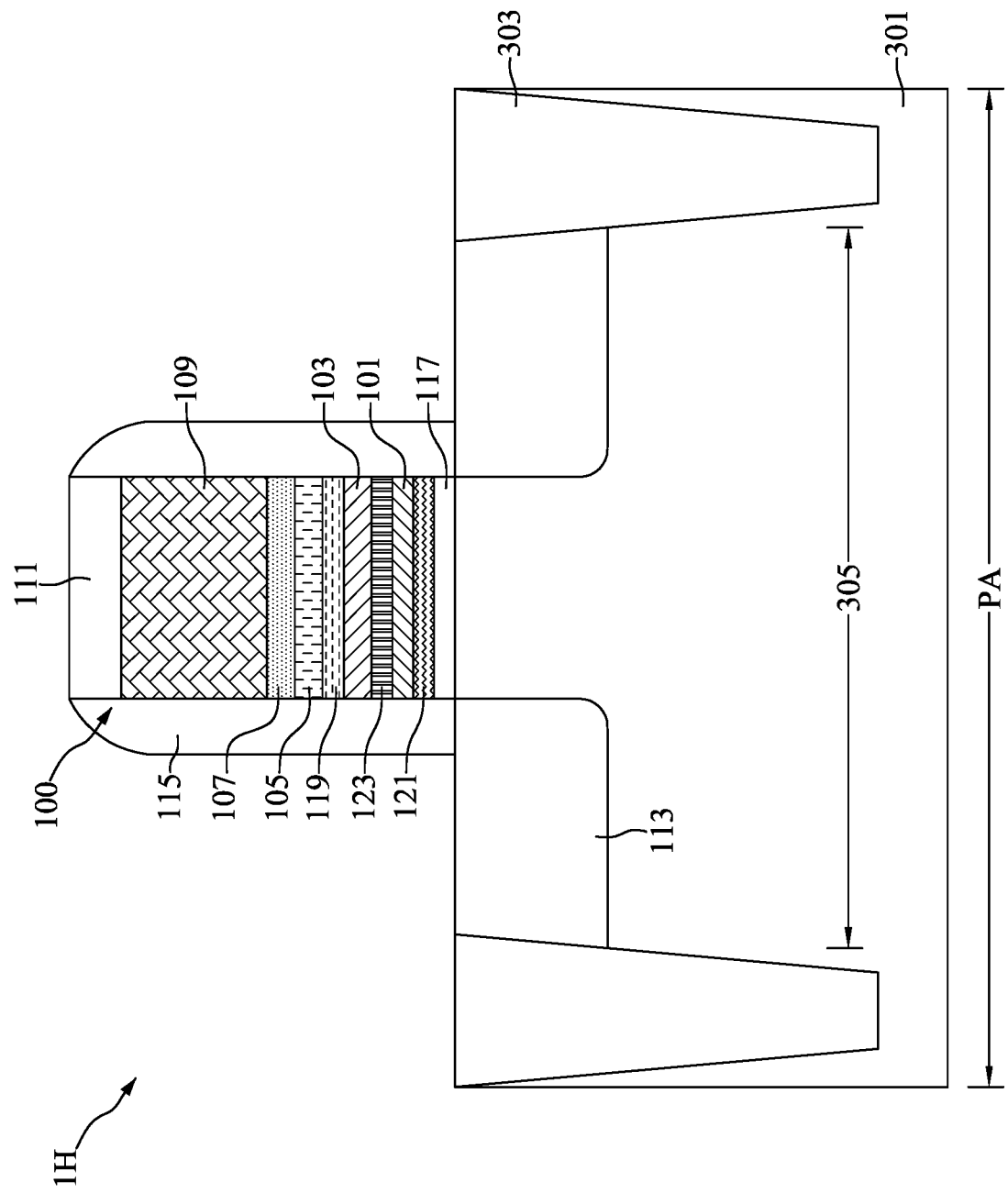

With reference to FIG. 8, the semiconductor device 1H may have a structure similar to that illustrated in FIG. 1. The same or similar elements in FIG. 8 as in FIG. 1 have been marked with similar reference numbers and duplicative descriptions have been omitted.

In the semiconductor device 1H, the interfacial layer 117 may be disposed on the substrate 301. The dipole layer 121 may be disposed between the first gate dielectric layer 101 and the interfacial layer 117. The functional layer 123 may be disposed between the first gate dielectric layer 101 and the first gate protection layer 103. The adjustment layer 119 may be disposed between the first work function layer 105 and the first gate protection layer 103.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 9:
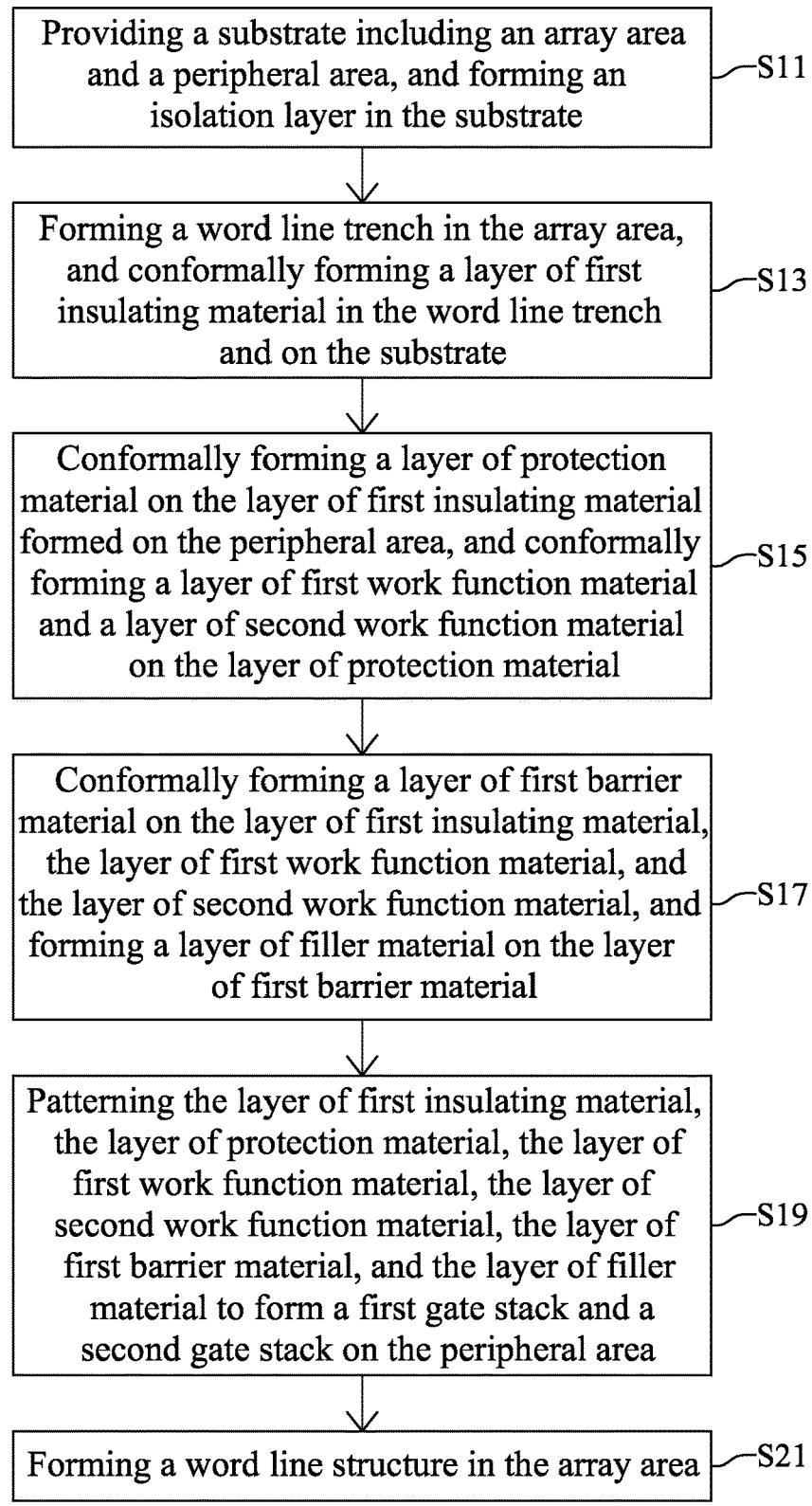
FIG. 9 illustrates, in a flowchart diagram form, a method for fabricating a semiconductor device in accordance with one embodiment of the present disclosure.

FIG. 9 illustrates, in a flowchart diagram form, a method 10 for fabricating a semiconductor device 1A in accordance with one embodiment of the present disclosure. FIGS. 10 to 23 illustrate, in schematic cross-sectional view diagrams, a flow for fabricating the semiconductor device 1A in accordance with one embodiment of the present disclosure.

Figure 10:
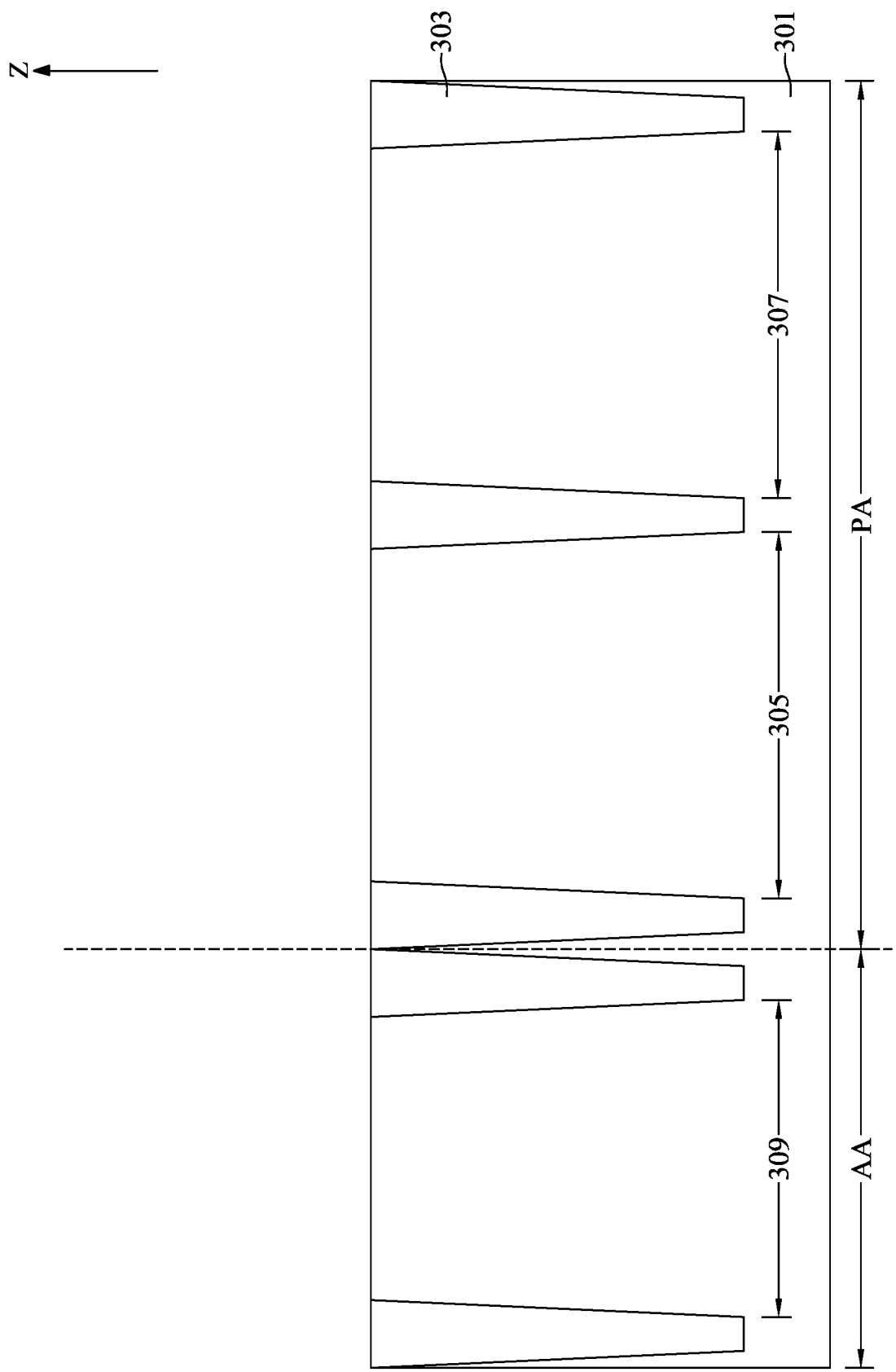
FIGS. 10 to 23 illustrate, in schematic cross-sectional view diagrams, a flow for fabricating the semiconductor device in accordance with one embodiment of the present disclosure.

With reference to FIGS. 9 and 10, at step S11, a substrate 301 including an array area AA and a peripheral area PA may be provided, and an isolation layer 303 may be formed in the substrate 301.

With reference to FIG. 10, the peripheral area PA may surround the array area AA. A series of deposition processes may be performed to deposit a pad oxide layer (not shown) and a pad nitride layer (not shown) on the substrate 301. A photolithography process may be performed to define the position of the isolation layer 303. After the photolithography process, an etch process, such as an anisotropic dry etch process, may be performed to form trenches penetrated through the pad oxide layer, the pad nitride layer, and the substrate 301. An insulating material may be deposited into the trenches and a planarization process, such as chemical mechanical polishing, may be subsequently performed to remove excess filling material until expose the substrate 301 and form the isolation layer 303. The insulating material may be, for example, silicon oxide, silicon nitride, silicon oxynitride, silicon nitride oxide, or fluoride-doped silicate. The isolation layer 303 may define a first active area 305 and a second active area 307 in the peripheral area PA, and an array active area 309 in the array area AA.

Figure 11:
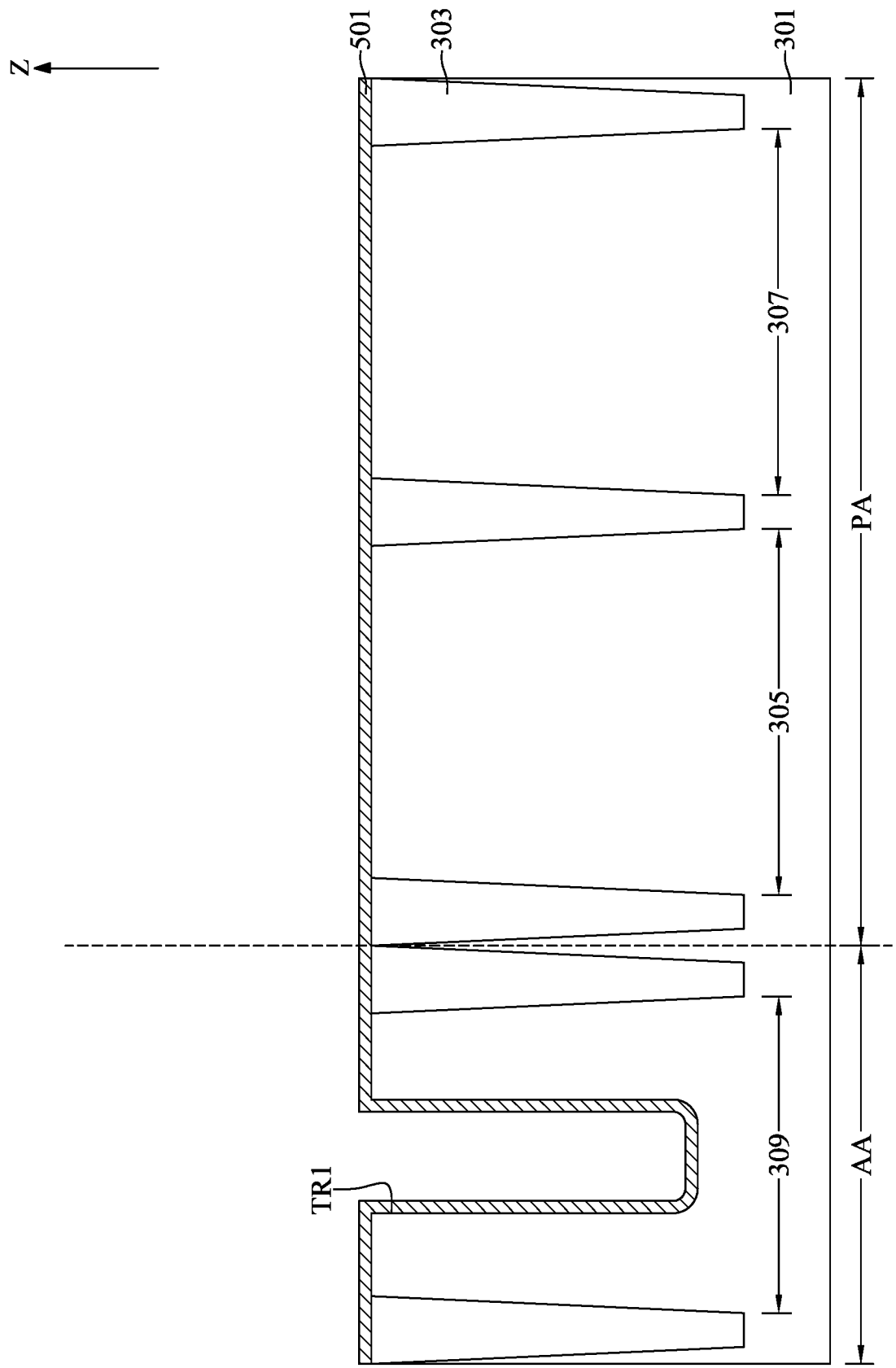

With reference to FIGS. 9 and 11, at step S13, a word line trench TR1 may be formed in the array area AA, a layer of first insulating material 501 may be conformally formed in the word line trench TR1 and on the substrate 301.

With reference to FIG. 11, a photolithography process may be performed to define the position of the word line trench TR1 at the array area AA. After the photolithography process, an etch process, such as an anisotropic dry etch process, may be performed to remove a portion of the substrate 301 and form the word line trench TR1. The layer of first insulating material 501 may be conformally formed in the word line trench TR1 and on the substrate 301 by, for example, chemical vapor deposition, atomic layer deposition, or other application deposition process. The first insulating material 501 may be, for example, hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof.

Figure 12:
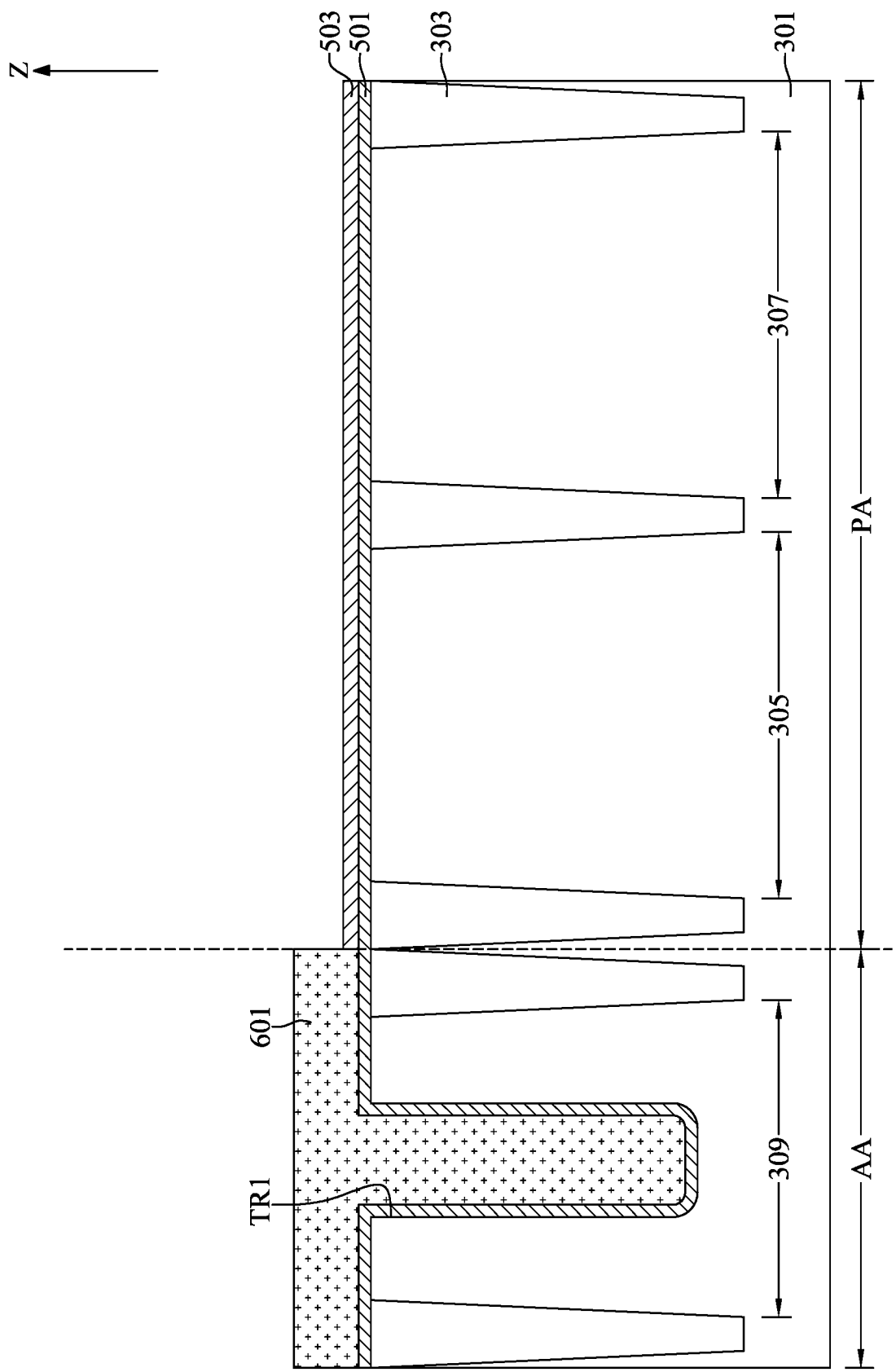
Figure 13:
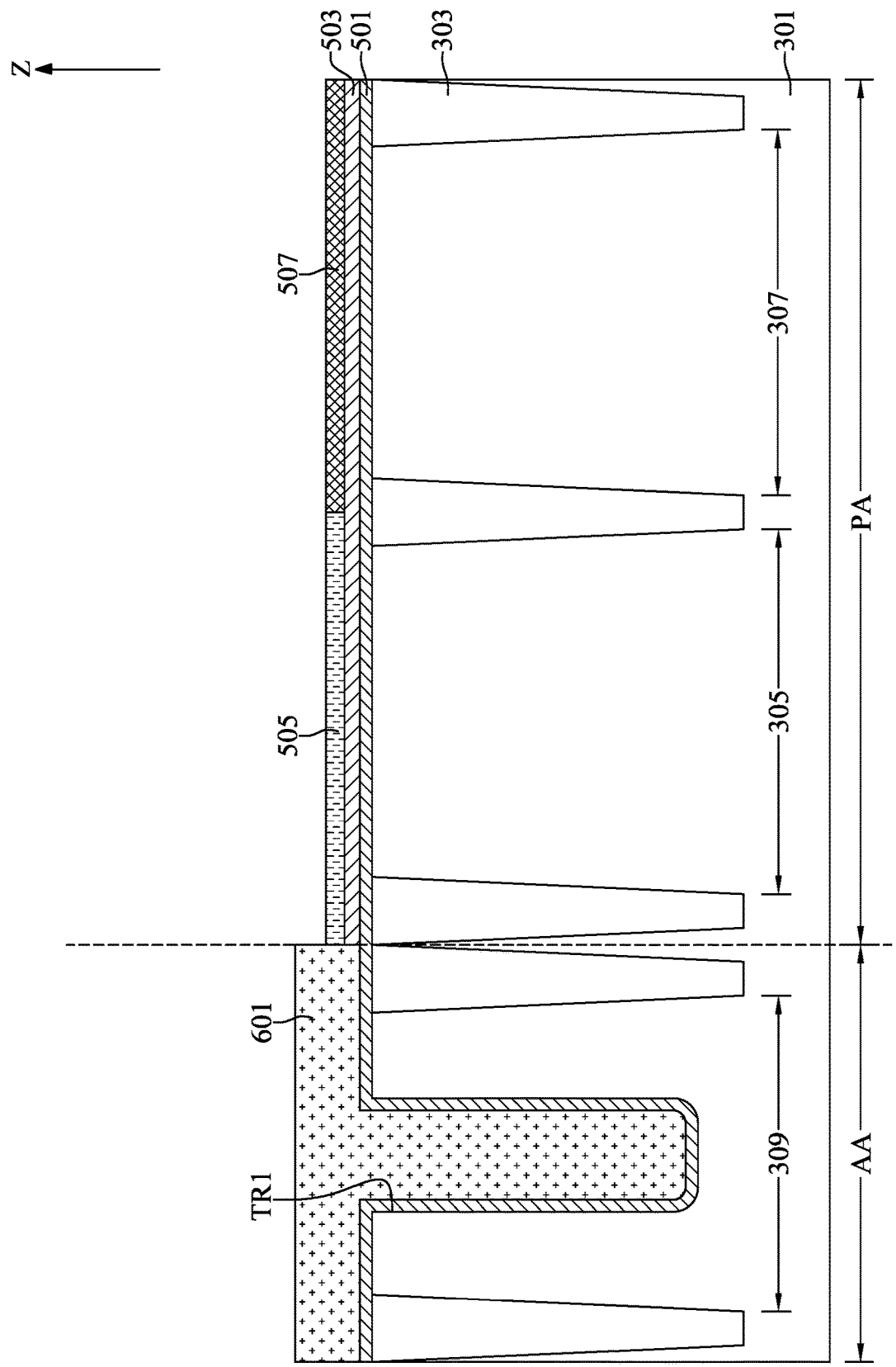

With reference to FIGS. 9, 12, and 13, at step S15, a layer of protection material 503 may be conformally formed on the layer of first insulating material 501 formed on the peripheral area PA, and a layer of first work function material 505 and a layer of second work function material 507 may be conformally formed on the layer of protection material 503.

With reference to FIG. 12, a first mask layer 601 may be formed to cover the array area AA. The first mask layer 601 may be, for example, silicon nitride. The protection material 503 may be titanium silicon nitride.

In some embodiments, the layer of protection material 503 may be formed by a thermal chemical vapor deposition process. During the thermal chemical vapor deposition process, a titanium-containing gas, a silicon-containing gas, and a nitrogen-containing gas may be introduced to the layer of first insulating material 501 over the peripheral area PA to form a titanium silicon nitride film (i.e., the layer of protection material 503). The titanium-containing gas may be, for example, tetraxydimethylaminotitanium or tetraxydiethylaminotitanium. The silicon-containing gas may be, for example, $SiH_2Cl_2$, $SiHCl_3$, $SiCl_4$, $SiH_4$, or $Si_2H_6$. The nitrogen-containing gas may be, for example, ammonia or monomethylhydrazine. The flow rate of the titanium-containing gas may be between about 5 standard cubic centimeters per minute (sccm) and about 50 sccm. The flow rate of the silicon-containing gas may be between about 5 sccm and about 500 sccm. The flow rate of the nitrogen-containing gas may be between about 50 sccm and about 500 sccm. The process pressure of the thermal chemical vapor deposition process may be between about 0.3 Torr and about 5 Torr. The process temperature may be between about 400° C. and about 650° C.

Alternatively, in some embodiments, the layer of protection material 503 may be formed by a plasma chemical vapor deposition process. The gas for generating plasma may be, for example, hydrogen and argon. The frequency of radio-frequency power of the plasma may be 13.56 MHz. The radio-frequency power of the plasma may be between about 200 W and about 800 W. The flow rate of the titanium-containing gas (e.g., $TiCl_4$) may be between about 1 sccm and about 10 sccm. The flow rate of the silicon-containing gas (e.g., $SiH_4$) may be between about 0.1 sccm and about 10 sccm. The flow rate of the nitrogen-containing gas ($N_2$) may be between about 30 sccm and about 500 sccm. The flow rate of hydrogen may be between about 100 and 3000 sccm. The flow rate of argon may be between about 100 and 2000 sccm. The process pressure of the plasma chemical vapor deposition process may be between about 0.5 Torr and about 5 Torr. The process temperature may be between about 350° C. and about 450° C.

Alternatively, in some embodiments, a layer of titanium nitride and a layer of silicon nitride may be sequentially formed on the layer of first insulating material 501 formed on the peripheral area PA. An annealing process may be performed to turn the layer of titanium nitride and the layer of silicon nitride into a titanium silicon nitride film (i.e., the layer of protection material 503).

With reference to FIG. 13, in some embodiments, the layer of first work function material 505 and the layer of second work function material 507 may be formed separately. In some embodiments, the layer of first work function material 505 and the layer of second work function material 507 may be formed of the same material and may be formed concurrently. The first work function material 505 and the second work function material 507 may be, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The layer of first work function material 505 and the layer of second work function material 507 may be formed by, for example, atomic layer deposition, plasma vapor deposition, chemical vapor deposition, or other applicable deposition process.

Figure 14:
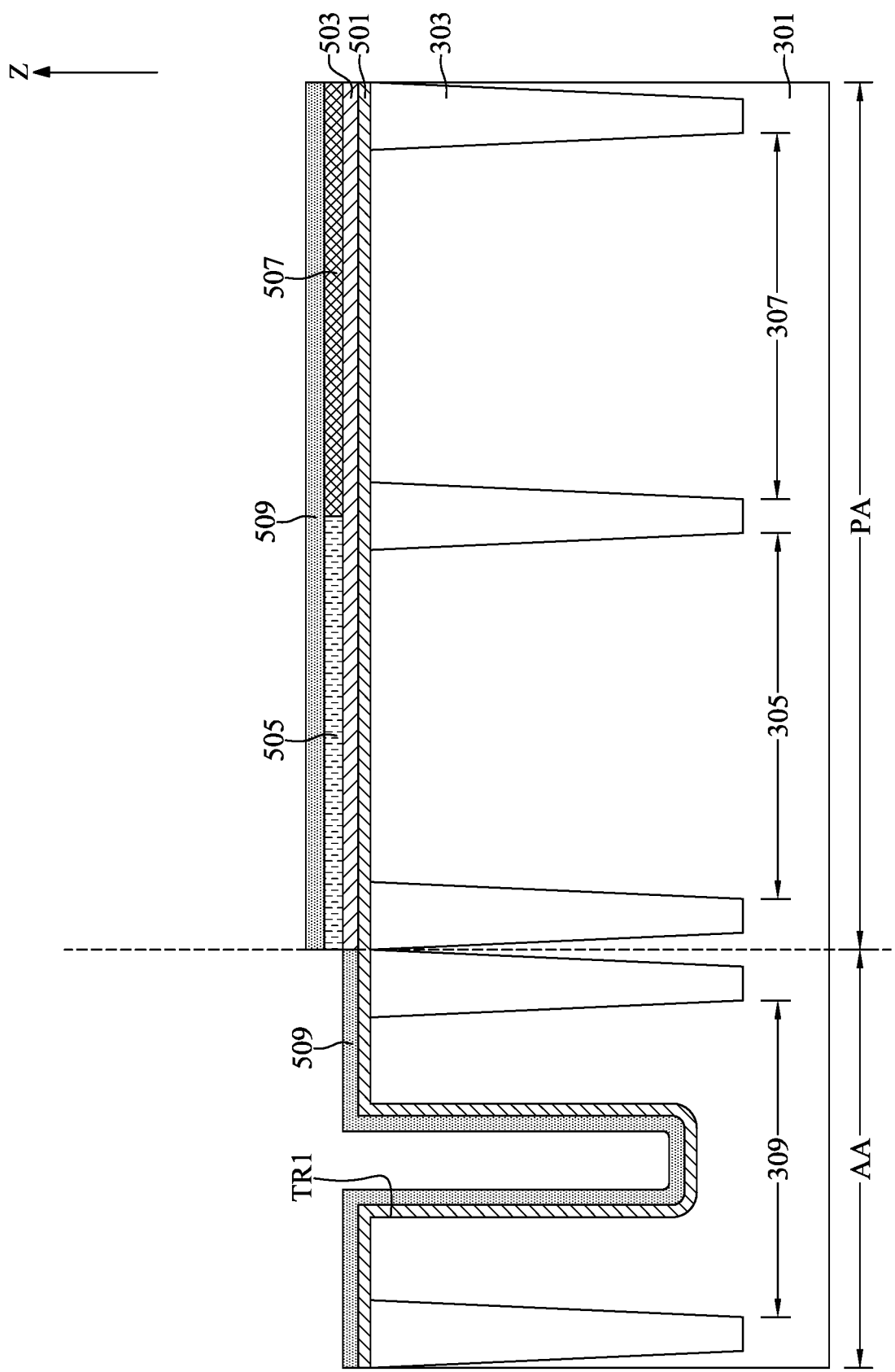
Figure 15:
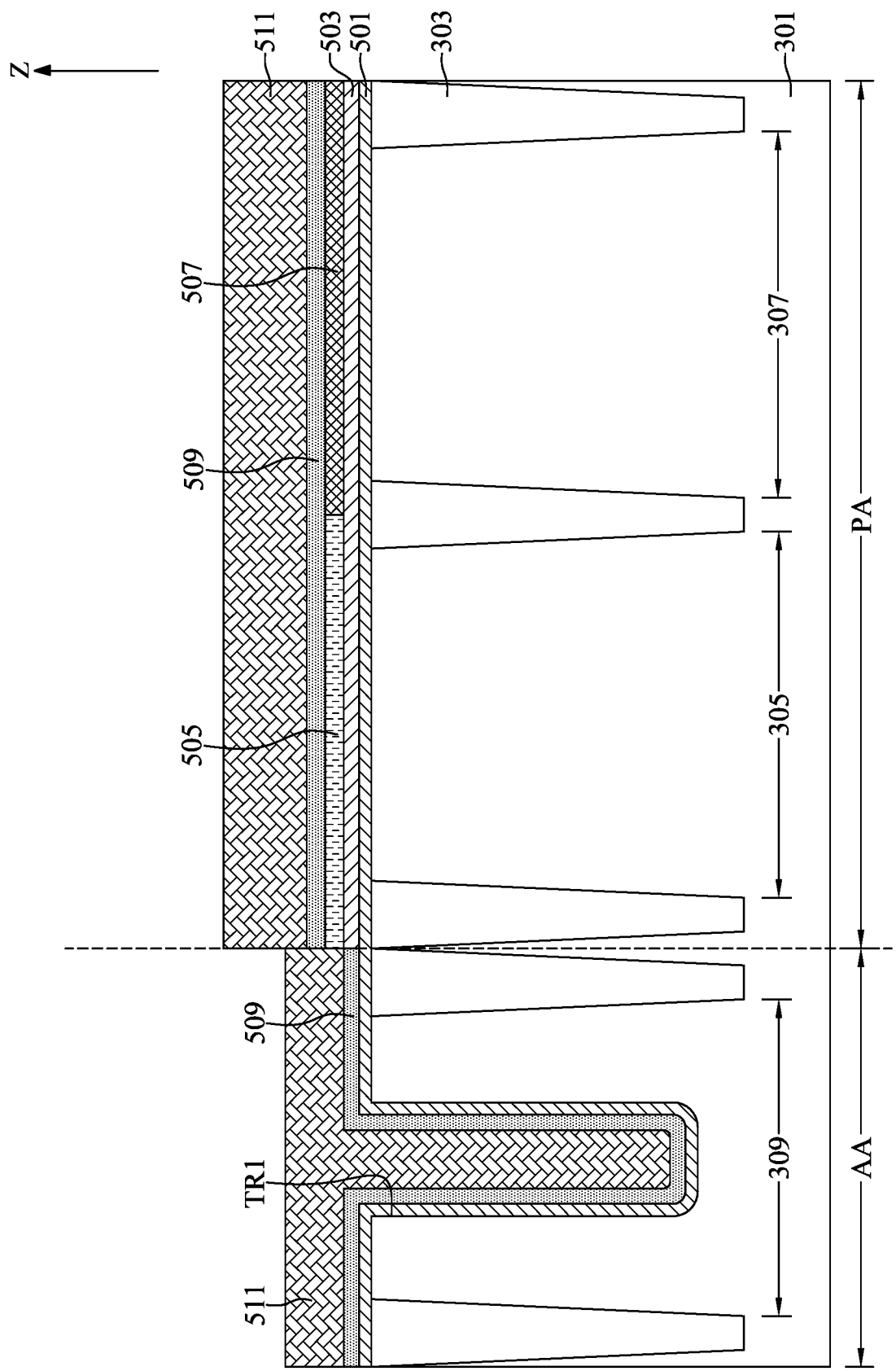

With reference to FIGS. 9, 14, and 15, at step S17, a layer of first barrier material 509 may be conformally formed on the layer of first insulating material 501, on the layer of first work function material 505, and on the layer of second work function material 507, and a layer of filler material 511 may be formed on the layer of first barrier material 509.

With reference to FIG. 14, the first mask layer 601 may be removed. Subsequently, the layer of first barrier material 509 may be conformally formed on the layer of first work function material 505, on the layer of second work function material 507, and on the layer of first insulating material 501 formed in the array area AA. The layer of first barrier material 509 may be formed by, for example, chemical vapor deposition, atomic layer deposition, physical vapor deposition, or other applicable deposition process. The first barrier material 509 may be titanium, titanium nitride, tantalum, tantalum nitride, or a combination thereof.

With reference to FIG. 15, the layer of filler material 511 may be formed on the layer of first barrier material 509. The layer of filler material 511 may be formed by, for example, physical vapor deposition, chemical vapor deposition, sputtering, or other applicable deposition process. The filler material 511 may be, for example, tungsten, aluminum, doped polysilicon, silicon germanium, metal, metal alloy, metal silicide, metal nitride, or metal carbide. In some embodiments, a planarization process, such as chemical mechanical polishing, may be performed to provide a substantially flat surface for subsequent processing steps.

With reference to FIG. 9 and FIGS. 16 to 19, at step S19, the layer of first insulating material 501, the layer of protection material 503, the layer of first work function material 505, the layer of second work function material 507, the layer of first barrier material 509, and the layer of filler material 511 may be patterned to form a first gate stack 100 and a second gate stack 200 on the peripheral area PA.

Figure 16:
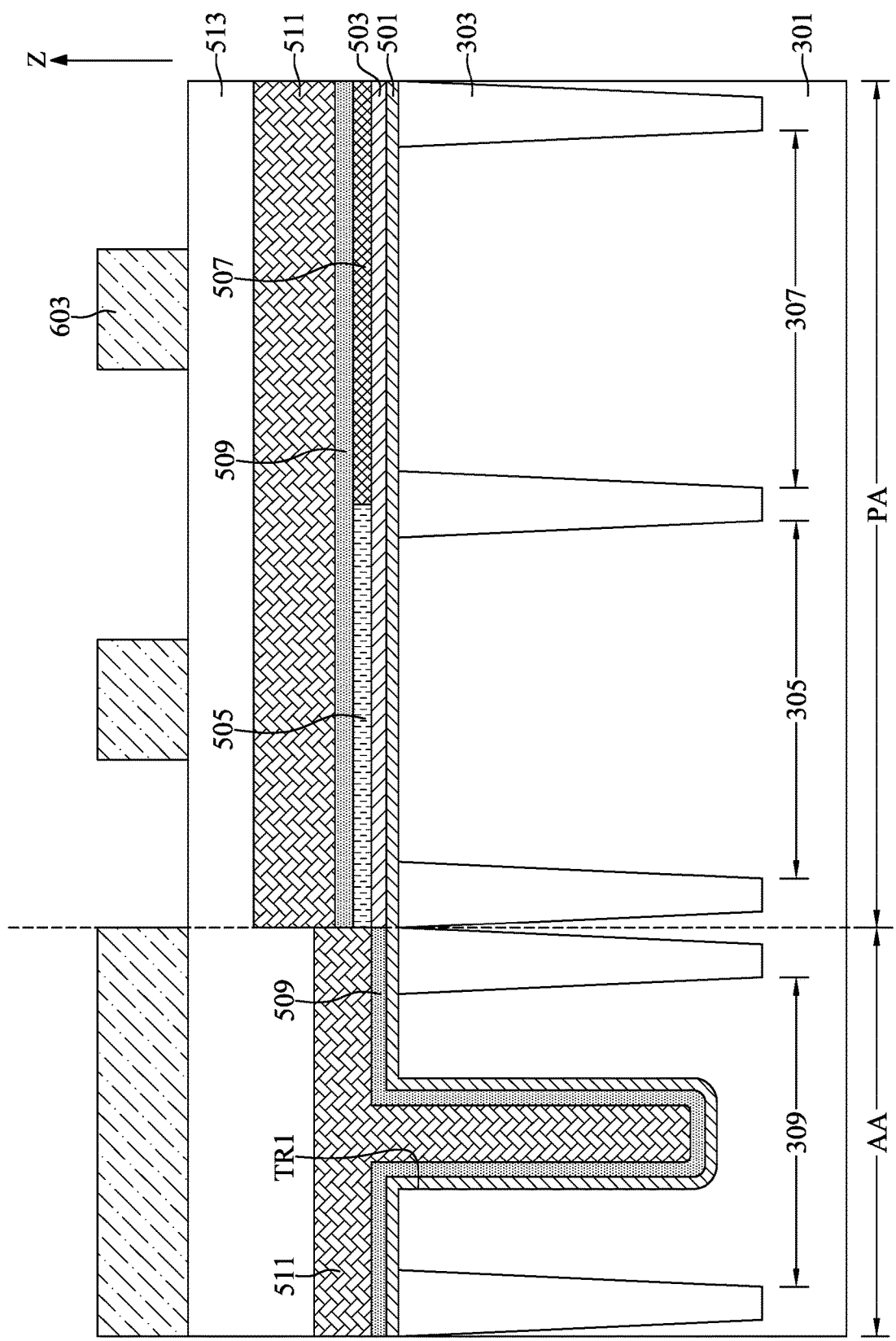

With reference to FIG. 16, a layer of hard mask material 513 may be formed on the layer of filler material 511. A planarization process, such as chemical mechanical polishing, may be performed to provide a substantially flat surface for subsequent processing steps. A second hard mask layer 603 may be formed on the layer of hard mask material 513. The second hard mask layer 603 may include the pattern of the first gate stack 100 and the second gate stack 200. It should be noted that the array area AA may be covered by the second hard mask layer 603.

Figure 17:
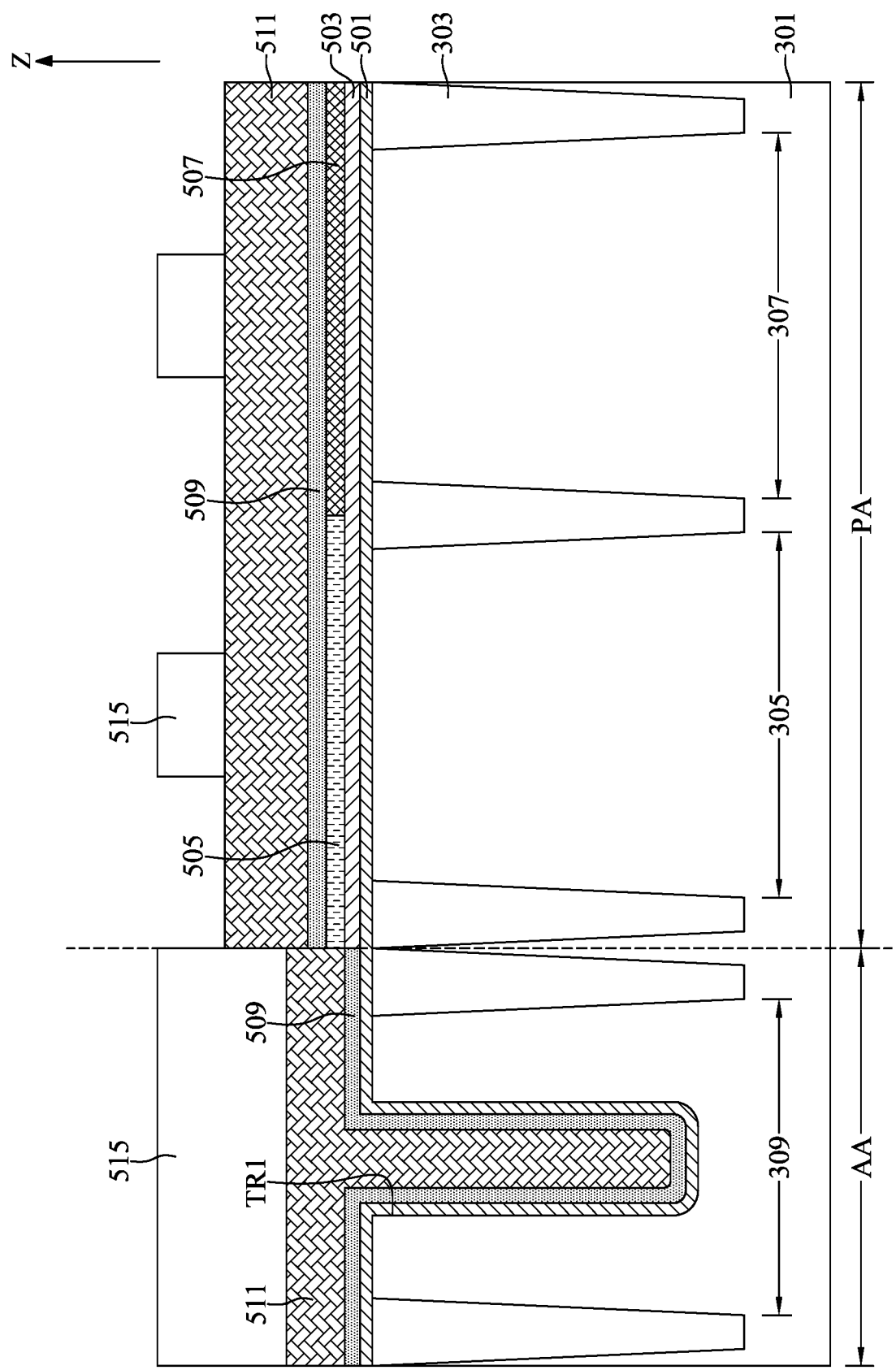

With reference to FIG. 17, an etch process, such as an anisotropic dry etch process, may be performed to transfer the pattern of the first gate stack 100 and the second gate stack 200 onto the hard mask layer 515 (also referred to as the patterned hard mask layer 515).

Figure 18:
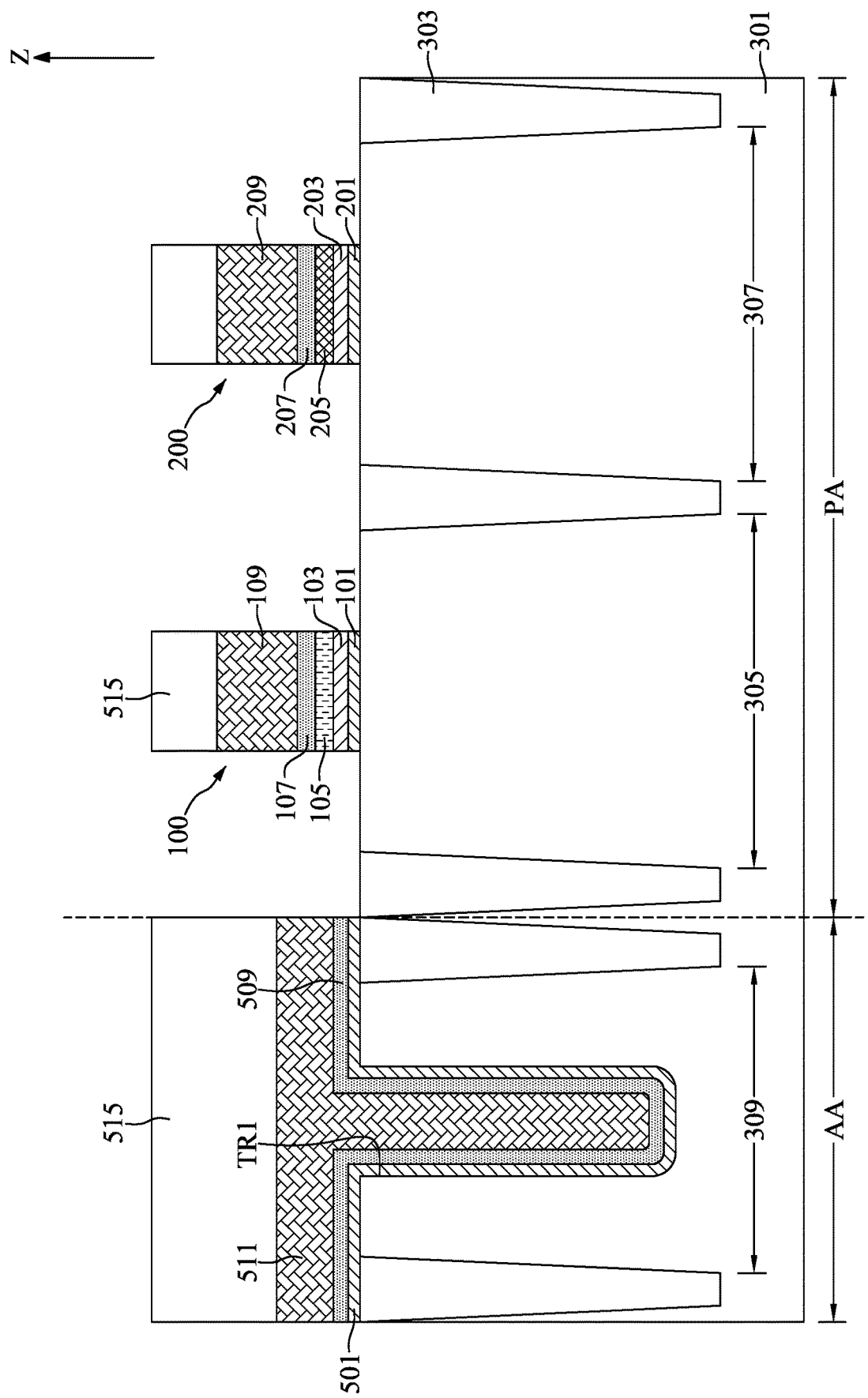

With reference to FIG. 18, an etch process, such as an anisotropic dry etch process, may be performed using the patterned hard mask layer 515 as the mask to remove portions of the first insulating material 501, the protection material 503, the first work function material 505, the second work function material 507, the first barrier material 509, and the filler material 511.

After the etch process, the layer of first insulating material 501 formed on the peripheral area PA may be turned into the first gate dielectric layer 101 and the second gate dielectric layer 201. The layer of protection material 503 may be turned into the first gate protection layer 103 and the second gate protection layer 203. The layer of first work function material 505 may be turned into the first work function layer 105. The layer of second work function material 507 may be turned into the second work function layer 205. The layer of first barrier material 509 formed on the peripheral area PA may be formed into the first gate barrier layer 107 and the second gate barrier layer 207. The layer of filler material 511 formed on the peripheral area PA may be turned into the first gate filler layer 109 and the second gate filler layer 209.

With reference to FIG. 18, the first gate dielectric layer 101, the first gate protection layer 103, the first work function layer 105, the first gate barrier layer 107, the first gate filler layer 109 may configure the first gate stack 100. The second gate dielectric layer 201, the second gate protection layer 203, the second work function layer 205, the second gate barrier layer 207, and the second gate filler layer 209 may configure the second gate stack 200.

Figure 19:
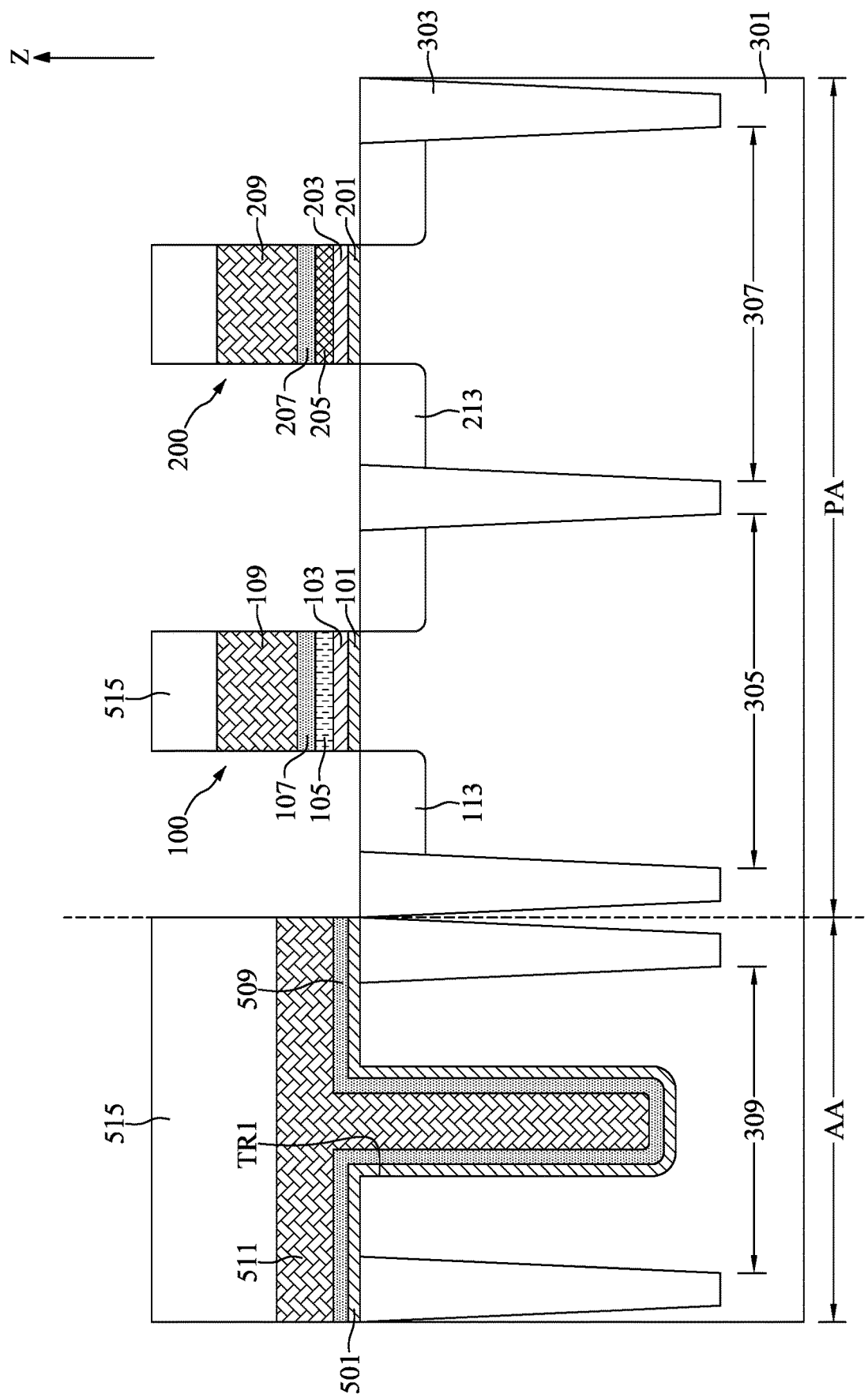

With reference to FIG. 19, an implantation process may be performed to form a plurality of first impurity regions 113 and a plurality of second impurity regions 213. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorus. In some embodiments, the dopant concentration of the plurality of first impurity regions 113 and the plurality of second impurity regions 213 may be between about 1E19 atoms/cm^3 and about 1E21 atoms/cm^3. After the implantation process, the plurality of first impurity regions 113 and the plurality of second impurity regions 213 may have an electrical type such as n-type or p-type. In some embodiments, the plurality of first impurity regions 113 and the plurality of second impurity regions 213 may be formed by two different implantation processes.

With reference to FIG. 1 and FIGS. 20 to 23, at step S21, a word line structure 400 may be formed in the array area AA.

Figure 20:
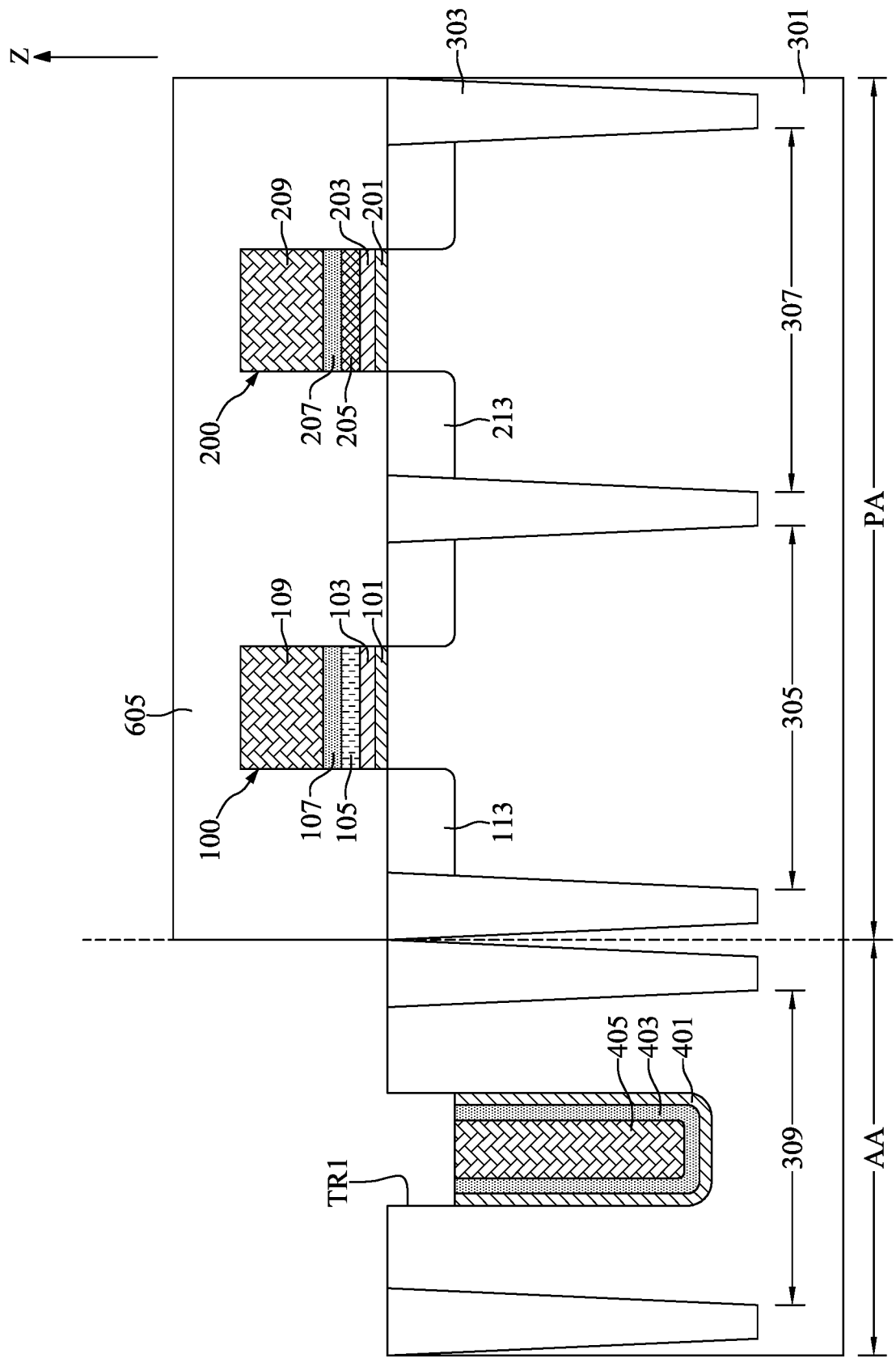

With reference to FIG. 20, a third mask layer 605 may be formed to cover the peripheral area PA. A recess process may be performed to remove portion of the first insulating material 501, the first barrier material 509, and the filler material 511 in the array area AA. After the recess process, the layer of first insulating material 501 may be turned into the word line insulating layer 401 in the word line trench TR1. The layer of first barrier material 509 may be turned into the word line barrier layer 403 in the word line trench TR1. The layer of filler material 511 may be turned into the word line conductive layer 405 in the word line trench TR1.

Figure 21:
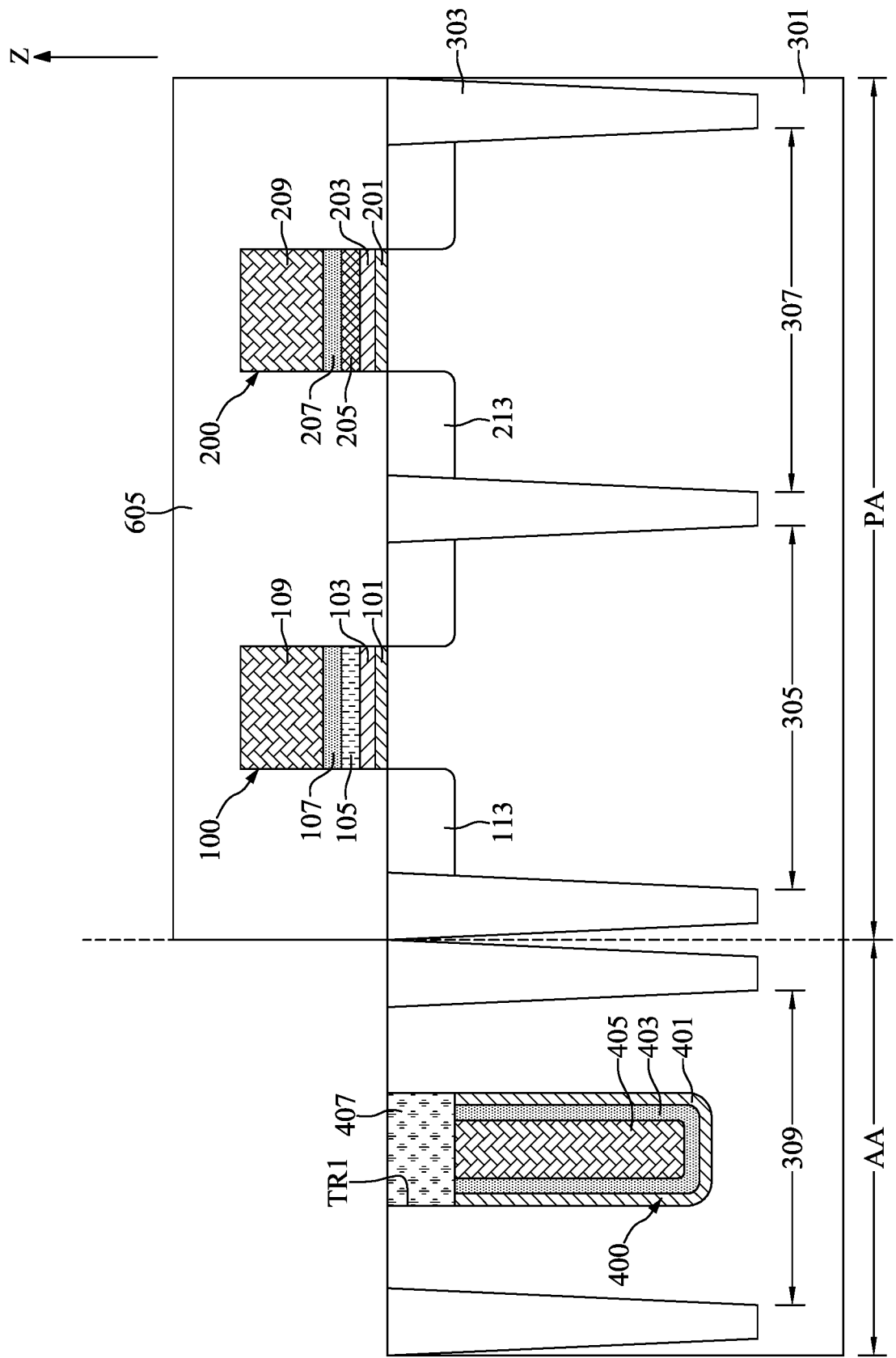

With reference to FIG. 21, a word line capping layer 407 may be formed to completely fill the word line trench TR1. The word line insulating layer 401, the word line barrier layer 403, the word line conductive layer 405, and the word line capping layer 407 together configure the word line structure 400.

Figure 22:
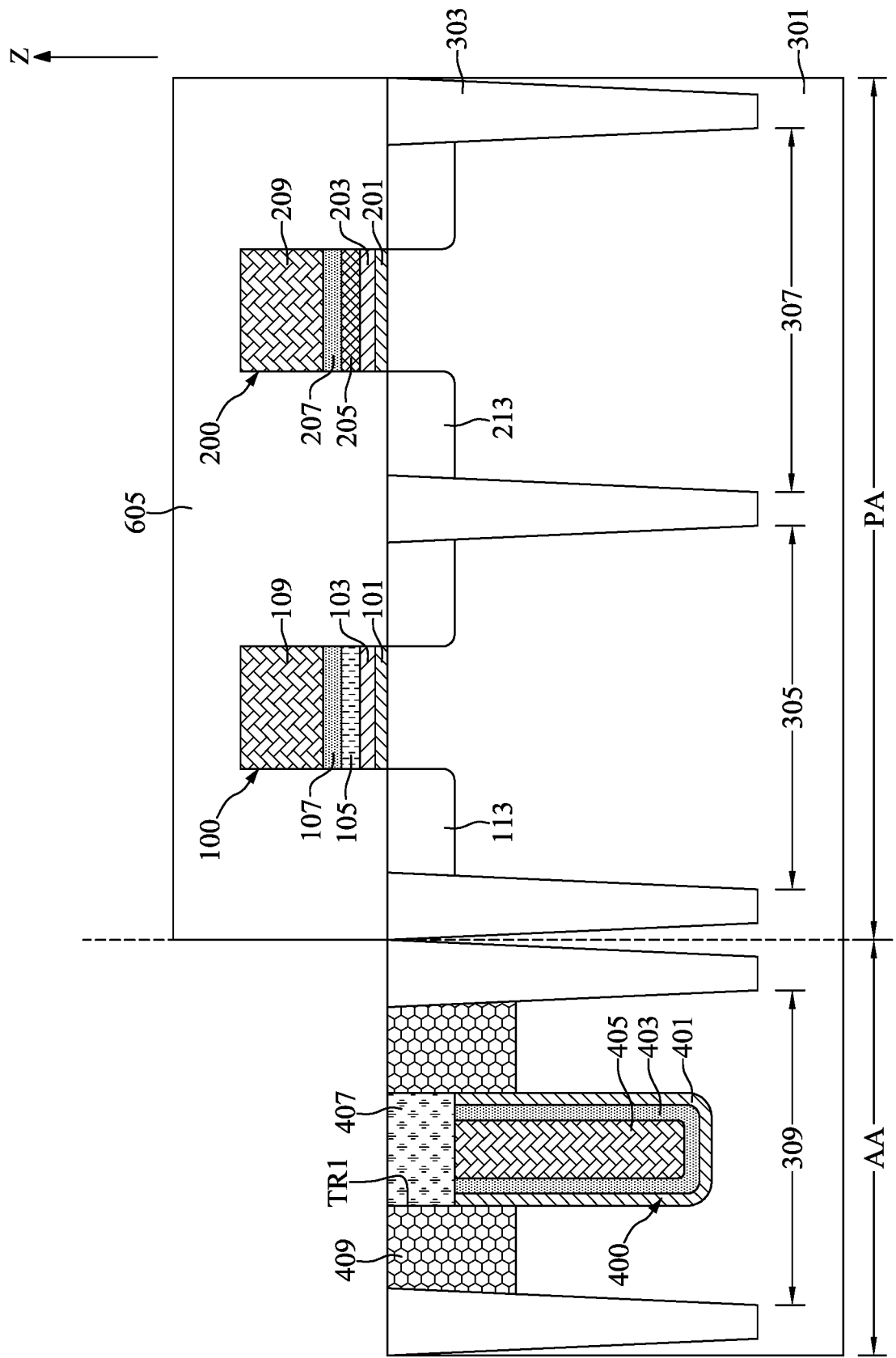

With reference to FIG. 22, an implantation process may be performed to form a plurality of word line impurity regions 409. The dopants of the implantation process may include p-type impurities (dopants) or n-type impurities (dopants). In some embodiments, the dopant concentration of the plurality of word line impurity regions 409 may be between about 1E19 atoms/cm^3 and about 1E21 atoms/cm^3. After the implantation process, the plurality of word line impurity regions 409 may have an electrical type such as n-type or p-type.

Figure 23:
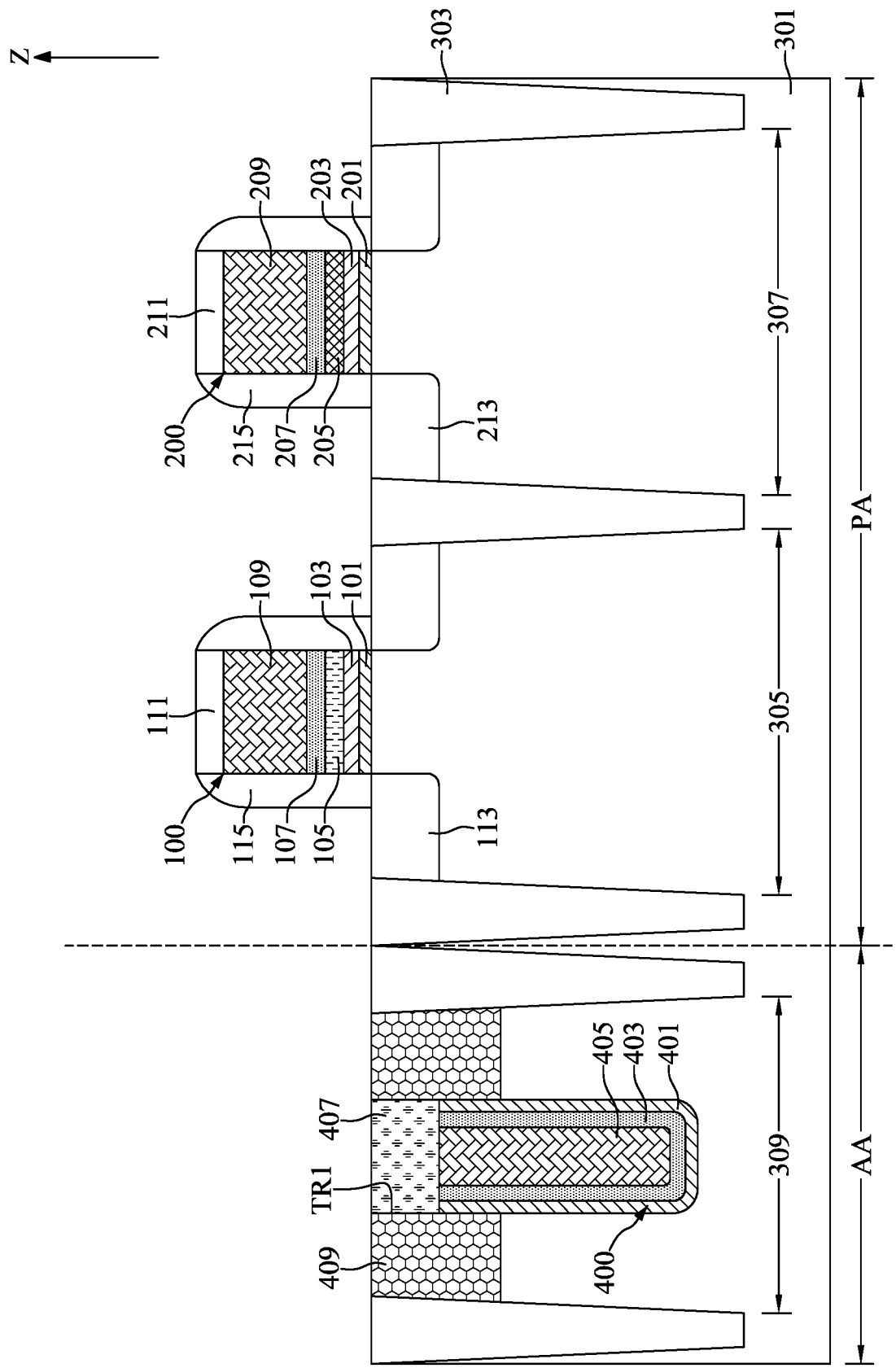

With reference to FIG. 23, the third mask layer 605 may be removed. Subsequently, a layer of spacer material (not shown) may be conformally formed over the substrate 301 to cover the first gate stack 100 and the second gate stack 200. The spacer material may be, for example, silicon oxide, silicon nitride, silicon oxynitride, silicon nitride oxide, or fluoride-doped silicate. An etch process, such as an anisotropic dry etch process, may be performed to remove portions of the spacer material and concurrently form the first gate capping layer 111, the first spacer layer 115, the second gate capping layer 211, and the second spacer layer 215.

One aspect of the present disclosure provides a semiconductor device including a substrate; and a first gate stack positioned on the substrate and including: a first gate dielectric layer positioned on the substrate; a first gate protection layer positioned on the first gate dielectric layer and including titanium silicon nitride; a first work function layer positioned on the first gate protection layer; and a first gate filler layer positioned on the first work function layer.

Another aspect of the present disclosure provides a semiconductor device including a substrate including an array area and a peripheral area surrounding the array area; a word line structure positioned in the array area; and a first gate stack positioned on the peripheral area and including: a first gate dielectric layer positioned on the peripheral area; a first gate protection layer positioned on the first gate dielectric layer and including titanium silicon nitride; a first work function layer positioned on the first gate protection layer; and a first gate filler layer positioned on the first work function layer.

Another aspect of the present disclosure provides a method for fabricating a semiconductor device including providing a substrate including an array area and a peripheral area surrounding the array area; forming a word line trench in the array area; conformally forming a layer of first insulating material in the word line trench and on the substrate; conformally forming a layer of protection material on the layer of first insulating material formed on the peripheral area; conformally forming a layer of first work function material on the layer of protection material; conformally forming a layer of first barrier material on the layer of first insulating material and the layer of first work function material; forming a layer of filler material on the layer of first barrier material; and patterning the layer of first insulating material, the layer of protection material, the layer of first work function material, the layer of first barrier material, and the layer of filler material to form a first gate stack on the peripheral area and a word line structure in the array area. The protection material includes titanium silicon nitride.

Due to the design of the semiconductor device of the present disclosure, the first gate protection layer 103 including titanium silicon nitride may have a low resistivity and an excellent barrier property, and is stable under heat. Thus, the first gate stack 100 including the first gate protection layer 103 formed of titanium silicon nitride may have excellent characteristics. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a first gate stack positioned on the substrate and comprising:
   a first gate dielectric layer positioned on the substrate;
   a first gate protection layer positioned on the first gate dielectric layer and comprising titanium silicon nitride;
   a first work function layer positioned on the first gate protection layer;
   a first gate filler layer positioned on the first work function layer, wherein a thickness of the first gate filler layer is larger than a thickness of the first gate dielectric layer;
   a first gate barrier layer positioned between the first work function layer and the first gate filler layer, wherein a bottom side of the first gate barrier layer is in direct contact with a top side of the first work function layer while a top side of the first gate barrier layer is in direct contact with a bottom side of the first gate filler layer;
   a first gate capping layer positioned on the first gate filler layer, wherein a bottom side of the first gate capping layer is in contact with a top side of the first gate filler layer, wherein a thickness of the first gate capping layer is smaller than the thickness of the first gate filler layer; and
   a first spacer layer disposed on two sidewalls of the first gate stack, wherein a bottom side of the first spacer layer is in contact with a top side of the substrate and a top end of the first spacer layer is coplanar with a top side of the first gate capping layer, wherein a width of the top end of the first spacer layer is smaller than a width of the bottom side of the first spacer layer;
   an interfacial layer which has a bottom side in contact with the top side of the substrate and a top side in contact with the first gate dielectric layer, wherein the interfacial layer is formed of a chemical oxide of the substrate, wherein the substrate comprises an array area and a peripheral area surrounding the array area, and the first gate stack is positioned on the peripheral area of the first gate dielectric layer; and
   an adjustment layer which has a bottom side in contact with the first gate protection layer and a top side in contact with the first work function layer for fine-tuning a threshold voltage of the first gate stack, wherein the first gate barrier layer comprises titanium nitride, or titanium/titanium nitride bi-layer.

2. The semiconductor device of claim 1, further comprising a dipole layer which has a bottom side in contact with a top side of the interfacial layer and a top side in contact with a bottom side of the first gate dielectric layer, wherein the first gate capping layer comprises silicon oxide, silicon nitride, silicon oxynitride, silicon nitride oxide, or fluoride-doped silicate, wherein the first gate capping layer and the first spacer layer are made of a same material.

3. The semiconductor device of claim 2, further comprising an isolation layer positioned in the peripheral area of the substrate and defining a first active area and a second active area next to the first active area;
  wherein the first gate stack is positioned on the first active area;
  wherein the first work function layer comprises a bottom work function layer positioned on the first gate protection layer and a top work function layer positioned on the bottom work function layer, wherein the bottom side of the first gate barrier layer is in direct contact with the top work function layer, wherein the bottom work function layer and the top work function layer are made of different materials.

4. The semiconductor device of claim 3, further comprising:
  a functional layer which has a bottom side in contact with a top side of the first gate dielectric layer and a top side in contact with a bottom side of the first gate protection layer; and
  a plurality of first impurity regions positioned in the first active area and adjacent to the first gate dielectric layer, wherein the first gate stack is contactless with the first impurity regions while the first spacer layer is disposed on and is in direct contact with at least one of the first impurity regions.

5. The semiconductor device of claim 4, further comprising a second gate stack positioned on the second active area and comprising:
  a second gate dielectric layer positioned on the second active area;
  a second gate protection layer positioned on the second gate dielectric layer and comprising titanium silicon nitride;
  a second work function layer positioned on the second gate protection layer;
  a second gate filler layer positioned on the second work function layer;
  a second gate barrier layer positioned between the second work function layer and the second gate filler layer, wherein a bottom side of the second gate barrier layer is in direct contact with a top side of the second work function layer while a top side of the second gate barrier layer is in direct contact with a bottom side of the second gate filler layer;
  a second gate capping layer positioned on the second gate filler layer, wherein a bottom side of the second gate capping layer is in contact with a top side of the second gate filler layer, wherein a thickness of the second gate capping layer is smaller than a thickness of the second gate filler layer; and
  a second spacer layer disposed on two sidewalls of the second gate stack, wherein a bottom side of the second spacer layer is in contact with a top side of the substrate and a top end of the second spacer layer is coplanar with a top side of the second gate capping layer, wherein a width of the top end of the second spacer layer is smaller than a width of the bottom side of the second spacer layer.

6. The semiconductor device of claim 5, wherein the thickness of the first gate dielectric layer and a thickness of the second gate dielectric layer are substantially the same, wherein the thickness of each of the first gate dielectric layer and the second gate dielectric layer is between 0.5 nm and 5.0 nm, wherein the thickness of the first gate filler layer and the thickness of the second gate filler layer are the same.

7. The semiconductor device of claim 6, wherein the first work function layer and the second work function layer comprise aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride, wherein a thickness of each of the first work function layer and the second work function layer is between 10 angstroms and 200 angstroms, wherein the thickness of the second gate filler layer is larger than the thickness of the second gate dielectric layer.

8. The semiconductor device of claim 6, wherein the first work function layer and the second work function layer comprise different materials.

9. The semiconductor device of claim 7, further comprising a plurality of second impurity regions positioned in the second active area and adjacent to the second gate dielectric layer, wherein the second gate stack is contactless with the second impurity regions while the second spacer layer is disposed on and is in direct contact with at least one of the second impurity regions, wherein the second gate capping layer and the second spacer layer are made of a same material.

10. The semiconductor device of claim 9, wherein an electrical type of the plurality of first impurity regions and an electrical type of the plurality of second impurity regions are the same.

11. The semiconductor device of claim 9, wherein an electrical type of the plurality of first impurity regions and an electrical type of the plurality of second impurity regions are different.

12. The semiconductor device of claim 9, further comprising a word line structure positioned in the array area, wherein the isolation layer further defines an array active area in the array area, wherein the word line structure is positioned in the array active area of the array area.

13. The semiconductor device of claim 12, wherein the word line structure comprises:
  a word line insulating layer inwardly positioned in the array area, wherein the word line insulating layer has a U-shaped configuration;
  a word line barrier layer having a U-shaped configuration disposed in the word line insulating layer at a position that a top side of the word line barrier layer is coplanar with a top side of the word line insulating layer;
  a word line conductive layer disposed in the word line barrier layer at a position that a top side of the word line conductive layer is coplanar with the top side of the word line insulting layer and the top side of the word line barrier layer; and
  a word line capping layer positioned on the word line insulating layer and the word line conductive layer at a position that a bottom side of the word line capping layer is direct contact with the top sides of the word line conductive layer, the word line barrier layer, and the word line insulting layer.

14. The semiconductor device of claim 13, wherein the word line capping layer comprises a bottom portion positioned on the word line insulating layer, the word line barrier layer, and the word line conductive layer, and a top portion positioned on and in direct contact with the bottom portion;
  wherein a width of the word line capping layer is equal to a width of the word line insulating layer;
  wherein the bottom portion comprises an insulating material having a dielectric constant of about 4.0 or greater;
  wherein the top portion comprises a low dielectric-constant material.

* * * * *